(12) United States Patent
Winters et al.

(10) Patent No.: US 7,439,670 B2
(45) Date of Patent: Oct. 21, 2008

(54) MAKING MULTICOLOR OLED DISPLAYS

(75) Inventors: Dustin L. Winters, Webster, NY (US); Jeffrey P. Spindler, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 555 days.

(21) Appl. No.: 11/050,162

(22) Filed: Feb. 3, 2005

(65) Prior Publication Data

US 2006/0172455 A1      Aug. 3, 2006

(51) Int. Cl.
  *H05B 33/12* (2006.01)
  *H05B 33/20* (2006.01)
  *H05B 33/22* (2006.01)
(52) U.S. Cl. .................................. 313/504; 313/506
(58) Field of Classification Search ......... 313/498–512; 315/169.3; 345/36, 45, 76
See application file for complete search history.

(56) References Cited

U.S. PATENT DOCUMENTS

| 4,800,375 | A | | 1/1989 | Silverstein et al. |
|---|---|---|---|---|
| 4,954,747 | A | * | 9/1990 | Tuenge et al. ............... 313/506 |
| 5,276,380 | A | | 1/1994 | Tang |
| 5,550,066 | A | | 8/1996 | Tang et al. |
| 6,570,584 | B1 | | 5/2003 | Cok et al. |
| 6,693,611 | B1 | | 2/2004 | Burroughes |
| 2002/0113546 | A1 | * | 8/2002 | Seo et al. .................... 313/504 |

OTHER PUBLICATIONS

U.S. Patent Application Publication 2002/0191130 A1.

* cited by examiner

*Primary Examiner*—Nimeshkumar D. Patel
*Assistant Examiner*—Christopher M Raabe
(74) *Attorney, Agent, or Firm*—Raymond L. Owens

(57) ABSTRACT

A method of making an OLED display having at least first, second, and third differently colored pixels includes providing a first light-emitting layer over a substrate for the first and second pixels and a providing a second light-emitting layer over the substrate for the third pixel wherein the first and second light-emitting layers produce light having different spectra and the light produced by the first light-emitting layer has substantial spectral components corresponding to the light output desired for the first and second pixels, and forming a first color filter in operative relationship with the first pixel and no color filter corresponding to the second pixel.

34 Claims, 5 Drawing Sheets

MAKING MULTICOLOR OLED DISPLAYS

CROSS REFERENCE TO RELATED APPLICATIONS

Reference is made to commonly assigned U.S. patent application Ser. No. 10/812,787 filed Mar. 29, 2004 by Michael E. Miller, et al., entitled "A Color OLED Display With Improved Power Efficiency", commonly assigned U.S. patent application Ser. No. 10/859,314 filed Jun. 2, 2004 by Michael E. Miller, et al., entitled "Color Display Device With Enhanced Pixel Pattern", commonly assigned U.S. patent application Ser. No. 10/812,786 filed Mar. 29, 2004 by Michael E. Miller, et al., entitled "A Color OLED Display With Improved Power Efficiency", commonly assigned U.S. patent application Ser. No. 10/812,629 filed Mar. 29, 2004 by Michael E. Miller, et al., entitled "A Color OLED Display With Improved Power Efficiency", commonly U.S. patent application Ser. No. 10/320,195 filed Dec. 16, 2002 by Michael E. Miller, et al., entitled "A Color OLED Display With Improved Power Efficiency", and commonly assigned U.S. patent application Ser. No. 10/977,839 filed Oct. 29, 2004 by Margaret J. Helber, et al., entitled "Organic Element For Electroluminescent Devices", the disclosures of which are herein incorporated by reference.

FIELD OF INVENTION

The present invention relates to organic light-emitting diode (OLED) displays. More specifically, this invention relates to making multicolor OLED displays having four or more pixels with improved power efficiency and color gamut.

BACKGROUND OF THE INVENTION

Color, digital image display devices based on organic light-emitting diodes (OLED) are well known. In the simplest form, an OLED is comprised of an anode for hole injection, a cathode for electron injection, and an organic media sandwiched between these electrodes to support charge recombination that yields emission of light. In order to construct an OLED display, a plurality of individually addressable OLED elements are arranged in a matrix of pixels. Each pixel includes an independently addressable OLED and is capable of producing light. Such matrixes can be of the passive type where electroluminescent OLED layers are sandwiched between two sets of orthogonal electrodes (rows and columns). An example of a passive matrix driven OLED display device is described in U.S. Pat. No. 5,276,380. Alternately, the OLED display can be constructed of the active matrix type where one or more circuit elements, such as a transistor or capacitor, is used to drive each OLED pixel. An example of an active matrix driven OLED display device is described in U.S. Pat. No. 5,550,066.

In order to construct a multicolor display, the pixels are arranged to produce a variety of colors. For example, a multicolor display can be constructed to have red, green, and blue pixels. Such a display is referred to as an RGB display. Additional colors can be achieved by such a display by mixing the light emitted by the red, green, and blue subpixels in various ratios.

However, the human eye is less sensitive to light emitted by the red pixels or the blue pixels compared to light emitted by the green pixels. As such, the red and blue pixels need to emit more light to achieve the desired brightness compared to the green pixels. This causes the display to consume a large amount of power.

Other displays, such as described in U.S. Pat. No. 6,693,611, having additional pixels which emit colors between that of the green and the red pixels or between that of the blue and green pixels have been proposed. These additional pixels emit light having a color to which the human eye is more sensitive compared to either the red pixels or the blue pixels. As such, one or more of these additional pixels can be combined with one or more of the other pixels to produce mixed colors, such as a white color. The resulting display can produce such mixed colors at a lower power consumption compared to a comparable RGB display.

One approach to constructing such a display having four or more differently colored pixels, as discussed in U.S. Pat. No. 6,693,611, is to provide separate OLED electroluminescent layers for each of the pixels. This results in the need to pattern one or more of the OLED electroluminescent layers such that it is precisely aligned with the desired pixel. Several methods of patterning OLED layers are known in the art. For example, OLED layers can be deposited through a shadow mask in order to selectively deposit only in the desired areas. Shadow masks should then be aligned with the target pixel. Such alignment processes, however, result in more complicated manufacturing time and can slow manufacturing throughput. Furthermore, the accuracy of the alignment of the shadow mask to the substrate tends to be poor, thereby requiring large tolerances for the patterned layers resulting in wasted surface area of the display. Shadow masks also tend to cause damage to the OLED pixels when the shadow mask contacts the display substrate. Alternate methods of separately patterning OLED layers for each layer are also known. For example, a method of pattering the OLED layers by transferring the OLED material from a donor sheet by use of a laser is known. However, this method requires the use of consumable donor substrates and complex laser writing equipment. The process of writing each pixel with a laser can also reduce manufacturing throughput. Another example process for patterning OLED layers involves deposition of the OLED materials dissolved in a solvent as droplets by way of an ink jet print head. This method requires the precision placement of the ink jet droplets. As such, complex structures for controlling droplet placement and spread can be required and tolerances for the pixel area can be large.

SUMMARY OF THE INVENTION

It is an object of the present invention to avoid the above mentioned problems and provide a method of making a multicolor OLED display that reduces the need for precisely patterning one or more of the OLED layers.

This object is achieved by a method of making an OLED display having at least first, second, and third differently colored pixels, comprising:

a) providing a first light-emitting layer over a substrate for the first and second pixels and a providing a second light-emitting layer over the substrate for the third pixel wherein the first and second light-emitting layers produce light having different spectra and the light produced by the first light-emitting layer has substantial spectral components corresponding to the light output desired for the first and second pixels; and b) forming a first color filter in operative relationship with the first pixel and no color filter corresponding to the second pixel.

ADVANTAGES

The present invention is a particularly effective way of making a multicolor OLED display having at least four different color pixels.

Because of the organization of the design of the multicolor OLED display, simplified manufacturing steps can be used with fewer precise alignments.

A feature of the present invention is that multicolor OLED displays made in accordance with the present invention can provide improved color gamut and have improved power efficiency.

DETAILED DESCRIPTION OF THE INVENTION

Figure 1:
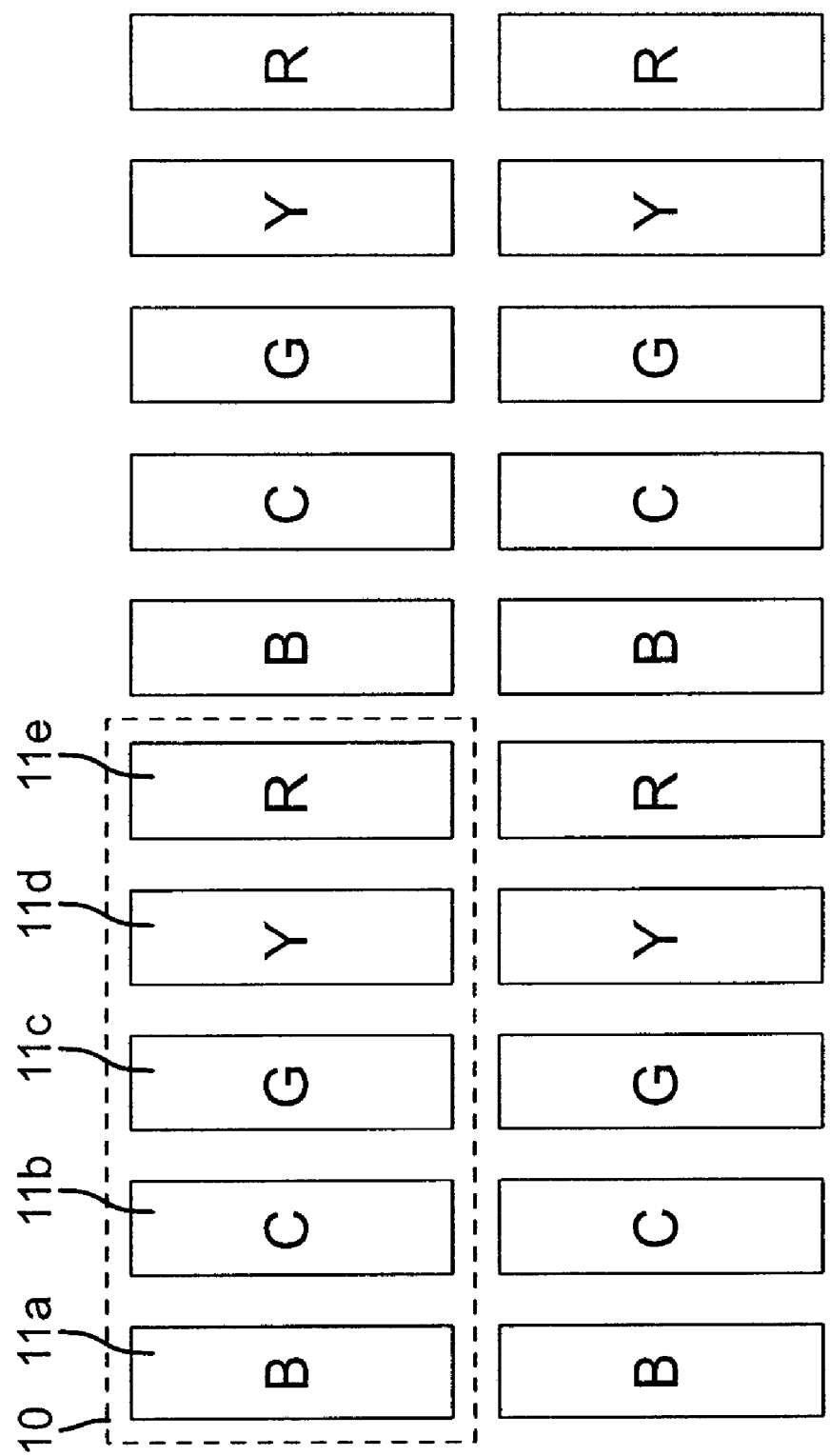
FIG. 1 shows a multicolor OLED display having five differently colored pixels.

FIG. 1 shows an example of a multicolor OLED display including five pixels which produce different colored light emission. For example, pixel 11a preferably produces blue light, pixel 11c preferably produces green light, and pixel 11e preferably produces red light. Pixel 11b preferably produces light having a color between that of the blue light of pixel 11a and the green light of pixel 11c. Such light can be for example, bluish-green or cyan (greenish-blue). Pixel 11d preferably produces light having a color between that of the red light of pixel 11e and the green light of pixel 11c. Such light can be for example, yellow, yellowish-green, yellowish-orange, orange, or reddish-orange. These pixels can be arranged in groups, such as pixel group 10. While it is shown that each pixel group includes each of the differently colored pixels, the present invention is not limited to this case. Instead, some colored pixels can be present in greater number than other colored pixels. For example, there can be twice as many red pixels as there are yellow pixels. As such, each pixel group does not have to contain a pixel having every color. Furthermore, while it is preferable to have the five differently colored pixels as previously described, some advantage can still be obtained if only four differently colored pixels are used. For example, a display can be constructed according to the present invention having red, green, blue, and yellow pixels. Alternately, a display can be constructed according to the present invention having red, green, blue and cyan pixels.

Figure 2:
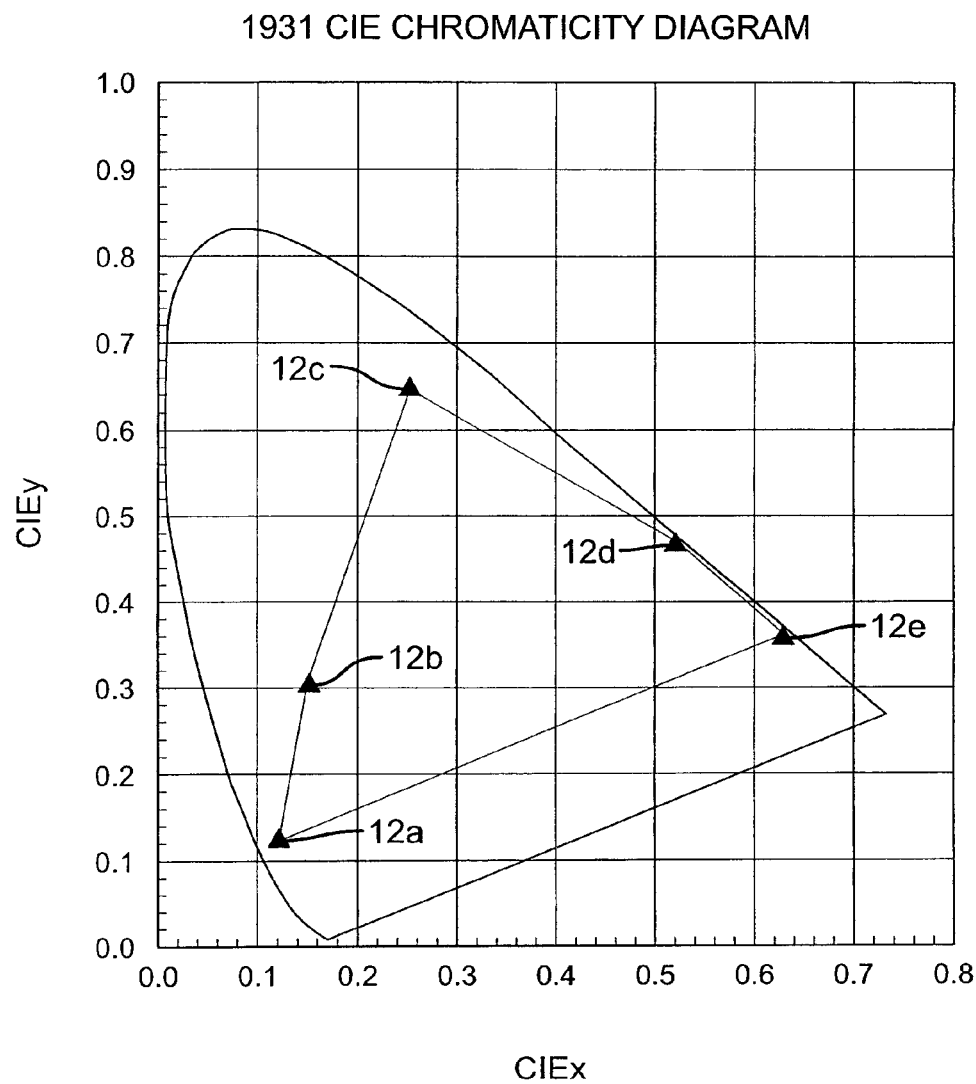
FIG. 2 depicts a 1931 CIE x,y chromaticity diagram illustrating the chromaticity of the light emission of the five differently colored pixels.

FIG. 2 shows a 1931 CIE x,y chromaticity diagram illustrating the chromaticity of the light emission of the five differently colored pixels. For example, light produced by pixel 11a has a spectra that results in chromaticity coordinate 12a, light produced by pixel 11b has a spectra that results in chromaticity coordinate 12b, light produced by pixel 11c has a spectra that results in chromaticity coordinate 12c, light produced by pixel 11d has a spectra that results in chromaticity coordinate 12d, and light produced by pixel 11e has a spectra that results in chromaticity coordinate 12e. It can be seen from FIG. 2 that chromaticity coordinate 12b lies approximately between chromaticity coordinate 12a and chromaticity coordinate 12c. It can also be seen from FIG. 2 that chromaticity coordinate 12d lies approximately between chromaticity coordinate 12e and chromaticity coordinate 12c. By mixing light from the five differently colored pixels in different ratios of intensities, colors having chromaticity coordinates in between chromaticity coordinates 12a, 12b, 12c, 12d, and 12e can be obtained. This collection of points that lie directly between chromaticity coordinates 12a, 12b, 12c, 12d, and 12e is known as a gamut. It is not necessary for the chromaticity coordinate 12b to be located perfectly on a line between chromaticity coordinate 12a and chromaticity coordinate 12c and it can actually deviate from such a position. So long as chromaticity coordinate 12b has a CIEx coordinate less than that of chromaticity coordinate 12c, a CIEy coordinate less than that of chromaticity coordinate 12c, and a CIEy coordinate greater than chromaticity coordinate 12a, pixel 11b can be considered to have a color between that of pixels 11a and 11c. Similarly, so long as chromaticity coordinate 12d has a CIEx coordinate greater than that of chromaticity coordinate 12c, a CIEy coordinate less than that of chromaticity coordinate 12c, and a CIEy coordinate greater than chromaticity coordinate 12e pixel 11d can be considered to have a color between that of pixels 11c and 11e. It is desirable that either pixel 11b or pixel 11d, or both, be constructed so as to produces light having a spectra resulting in a chromaticity coordinates outside the triangle defined by chromaticity coordinate 12a, chromaticity coordinate 12c, and chromaticity coordinate 12e so as to result in a larger possible color gamut than would be available with only pixels 11a, 11c, and 11e.

Figure 3:
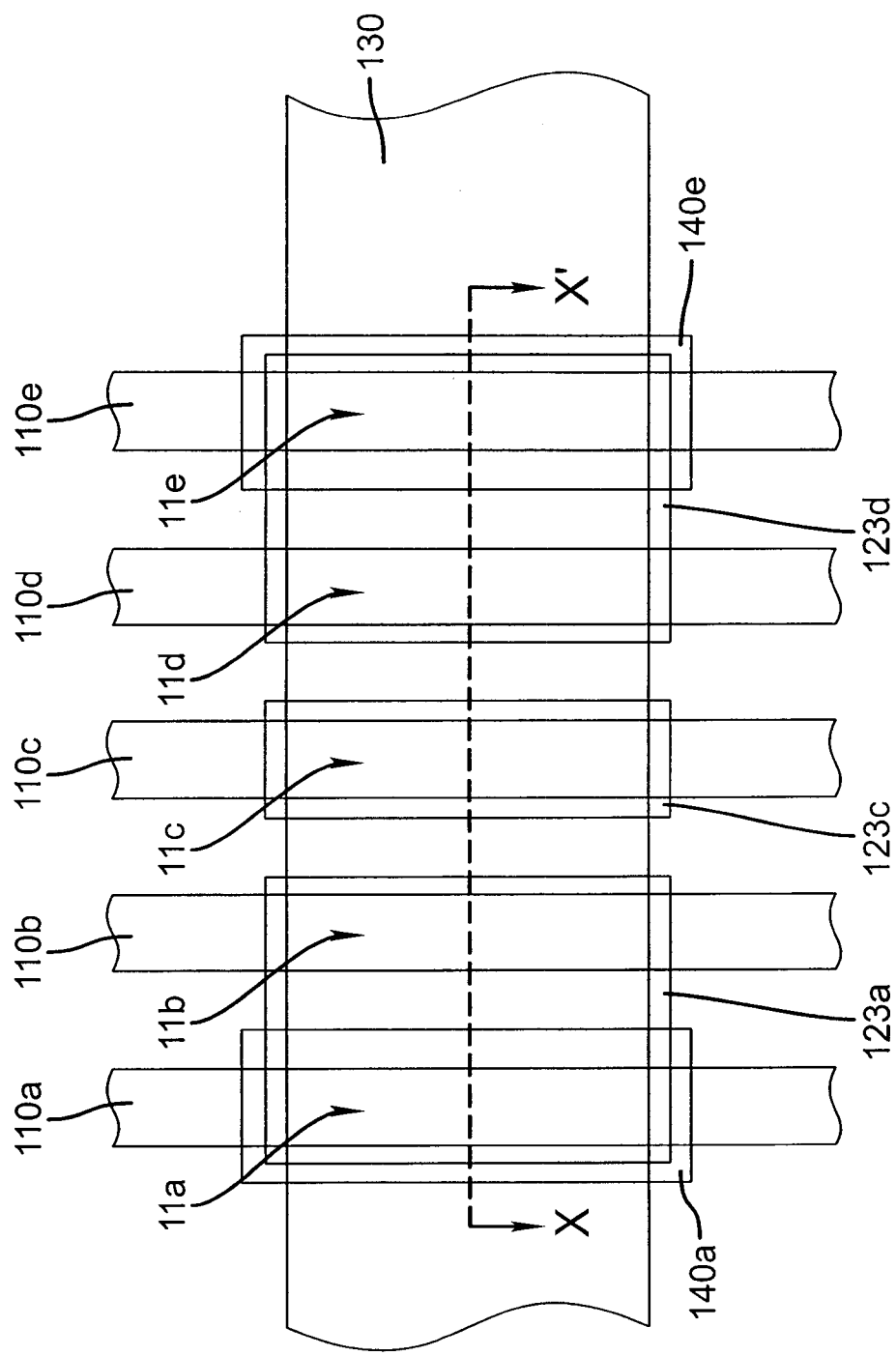
FIG. 3 shows a top side view of a pixel according to the first embodiment of the present invention.

FIG. 3 shows a top side view of pixels 11a, 11b, 11c, 11d, and 11e according to the first embodiment of the present invention. In a passive matrix configuration, these pixels can be addressed by providing a matrix of orthogonal electrodes such as first electrodes 110a, 110b, 110c, 110d, and 110e and second electrode 130. That is, pixel 11a is constructed from first electrode 110a and second electrode 130, pixel 11b is constructed from first electrode 110b and second electrode 130, pixel 11c is constructed from first electrode 110c and second electrode 130, pixel 11d is constructed from first electrode 110d and second electrode 130, and pixel 11e is constructed from first electrode 110e and second electrode 130. In this configuration, all pixels in a column share the same first electrode and all pixels in a row share the same second electrode. As such, these pixels are arranged into a stripe pattern. However, the present invention is not limited to this arrangement, and other arrangements such as delta pattern arrangements and quad arrangements can be applied by one skilled in the art.

Furthermore, the present invention is not limited to the passive matrix configuration and an active matrix driving scheme can be applied by one skilled in the art.

According to the present invention, light-emitting layer 123a is provided for pixel 11a and 11b to be common between both of these pixels. This requires light-emitting layer 123a to be precisely aligned to these pixels. Similarly, light-emitting layer 123d is provided to be shared between pixel 11d and 11e. Light-emitting layer 123c is provided for Pixel 11c and is not shared by the other differently colored pixels. By providing light-emitting layer 123a so as to be shared between two differently colored pixels and light-emitting layer 123d so as to be shared between another two differently colored pixels, the number of precision aligned depositions required to form these five differently colored pixels is reduced from five to three. Light-emitting layer 123a can be formed from a single step, such as for example, deposition through a single shadow mask, precise placement of one or more ink jet droplets from the same ink jet head, or transfer from the same donor sheet. As such, this layer can be continuous formed between pixels 11a and 11b as shown. This can be achieved, for example, by using a single opening in the shadow mask to deposit the entire layer. Similarly, light-emitting layer 123d can be formed from a single source and can be continuous between pixels 1d and 11e. Such a continuous arrangement is preferred to reduce surface area allocated for alignment tolerances in the manufacturing process. To facilitate such a continuous arrangement, the pixels which share the same light-emitting layer are preferably disposed to be adjacent to one and other. For example, pixel 11a is adjacent to pixel 11b and pixel 11d is adjacent to pixel 11e as shown. The present invention, however, is not limited to this preferred embodiment and alternate embodiments where the light-emitting layer is discontinuous between the two pixels or the two pixels are spaced apart are possible. Such alternate embodiments are still advantageous in that the number of precision aligned depositions is reduced.

Light-emitting layer 123a is preferably arranged to emit light having a spectrum corresponding to a color between blue and green as described previously. Light-emitting layer 123a is arranged so as to produce light having spectral components corresponding to the desired colors of both pixel 11a and pixel 11b. This can be achieved by forming light-emitting layer of materials that emit a broad spectrum of light in the blue, greenish blue, and bluish green wavelengths. As such, this unfiltered spectra emission is preferably used for pixel 11b. In order to achieve the blue color desired for pixel 1a, color filter 140a is formed in operative relationship to pixel 11a. By operative relationship, it is meant that the color filter is formed at least partially in the path of the light emission between the light-emitting layer and the viewer. Color filter 140a is constructed of materials to absorb undesired spectral components for pixel 11a and pass the desired spectral components corresponding to the desired a blue color. That is color filter 140a can be constructed, for example, to transmit blue light and absorb light having higher wavelengths.

Similarly, light-emitting layer 123d is preferably arranged to emit light having a spectrum corresponding to a color between red and green as described previously. Light-emitting layer 123d is arranged so as to produce light having spectral components corresponding to the desired colors of both pixel 11d and pixel 11e. As such this unfiltered emission is preferably used for pixel 11d. In order to achieve the red color desired for pixel 11e, color filter 140e is formed in the path of the light emission, or operative relationship, in pixel 11e to absorb undesired spectral components for pixel 11e and pass the desired spectral components corresponding to the desired a red color. Color filter 140e can be constructed, for example, to transmit red light and absorb light having lower wavelengths.

The above embodiment is described as providing five differently colored pixels. However, as previously mentioned, some advantage can still be obtained according to alternate embodiments whereby only four differently colored pixels are provided. For example, a multicolor display can be constructed according to the present invention by providing a first pixel emitting blue light, a second pixel emitting green light, a third pixel emitting red light, and a fourth pixel emitting a color between that of the first and second pixels. As such, a common light-emitting layer would be provided over the first and fourth pixels.

However, in this alternate four pixel embodiment, the third pixel would have a unique light-emitting layer. This light-emitting layer can be constructed, for example to produce red light, therefore no filter would be need to be provided for the third pixel.

Yet another alternate four pixel embodiment can be achieved by providing a first pixel emitting blue light, a second pixel emitting green light, a third pixel emitting red light, and a fourth pixel emitting a color between that of the second and third pixels. As such, a common light-emitting layer would be provided over the third and fourth pixels. In this alternate embodiment case, the first pixel would have a unique light-emitting layer. This light-emitting layer can be constructed, for example to produce blue light, therefore no filter would be need to be provided for the first pixel.

The above embodiments describe examples where the blue pixel and the pixel having a color between the blue and green pixel share a common light-emitting layer or where the red pixel and the pixel having a color between the red and green pixel share a common light-emitting layer or both. In these cases, the green pixel is constructed to have a light-emitting layer, which is not shared with another differently colored pixel. This is preferred since the human observer is more sensitive to green colored light compared to red and blue colored light so that the green pixel tends to have the highest efficiency for producing a desired level of brightness. Therefore, it is preferable to retain the high efficiency light-emitting layer of the green pixel and to replace the lower efficiency blue, red, or both light-emitting layers with filtered portions of the light-emitting layers which emit the broad spectra between these pixels and the green pixels as described above. Efficiency can be measured, for example, in candelas (cd) per ampere (A) of current. As such, high efficiency light emission result in displays that consume less power, or in other words, have high power efficiency.

However, some advantage according to yet another alternate embodiment of the present invention can also be achieved by instead providing a common light-emitting layer between the green pixel and the pixel having a color between that of the green pixel and the blue pixel and instead forming a color filter for the green pixel. Similarly, in yet another alternate embodiment of the present invention, some advantage can be achieved by instead providing a common light-emitting layer between the green pixel and the pixel having a color between that of the green pixel and the red pixel and forming a color filter for the green pixel. These alternate embodiments where the green pixel is provided with a light-emitting layer which is shared by another differently colored pixel and a color filter is formed in operative relationship with the green pixel can be applied in displays having four differently colored pixels or in displays having five differently colored pixels in various combinations of the above embodiments.

Figure 4:
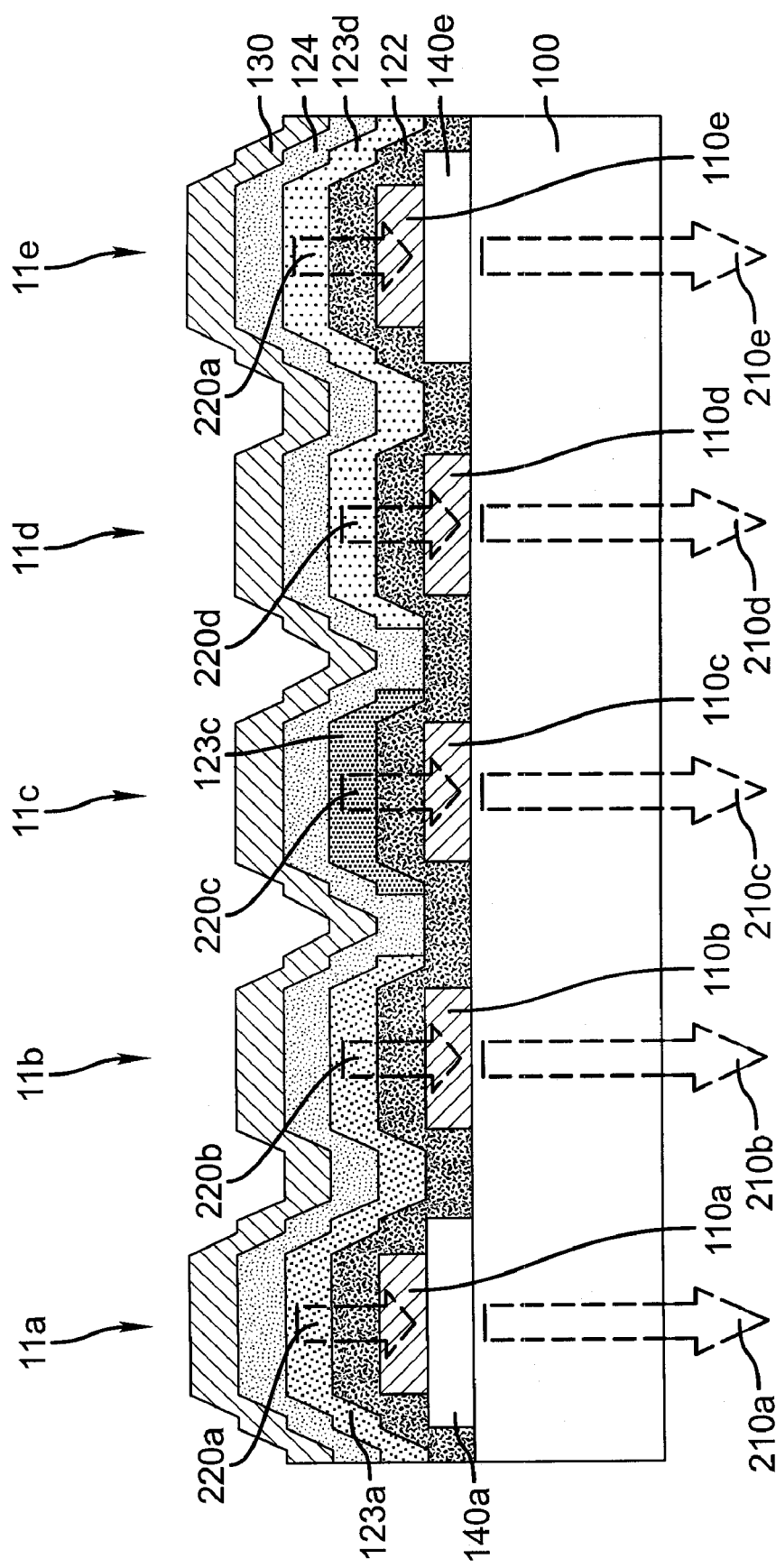
FIG. 4 shows a cross section view of an a group of pixels taken along the line X-X' of FIG. 3.

FIG. 4 shows a cross-sectional view of the device of FIG. 3 taken along line X-X'. FIG. 4 shows that pixels 11a, 11b, 11c, 11d, and 11e produce internal light emission 220a, 220b, 220c, 220d, and 220e, respectively. Internal light emission 220b, 220c, and 220d exit the device without filtration to become external light emission 210b, 210c, and 210d. Internal light emission 220a passes through color filter 140a prior to exiting the device resulting in external light emission 210a. Similarly, internal light emission 220e passes through color filter 140e prior to exiting the device resulting in external light emission 210e. Color filters 140a and 140e are preferably organic layers deposited by lamination or spin coating methods known in the are in the art. The color filters are preferably photo-patternable as is known in the art wherein the color filter materials are deposited over the entire display surface, exposed with a light source, and either the exposed or the unexposed regions are removed by use of a solvent. This method provides effective alignment accuracy to the desired pixel region. However, the present invention is not limited to this preferred case, and other ways of depositing and patterning the color filter material as are known in the art can be employed by one skilled in the art. Furthermore, additional black matrix structures (not shown) which absorb some portion of all visible light can optionally be disposed in the non-emitting regions between pixels to reduce ambient light reflection and improve display contrast as known in the art.

The pixels are constructed over substrate 100. Light can exit the device by passing through substrate 100 as shown. Such a configuration is known as a bottom emitting device. In this case, substrate 100 should be constructed of a transparent material such as glass or plastic. Alternately, the device can be constructed so that light exits the device in the direction opposite the substrate.

Such a configuration is known as a top emitting device. In this case the substrate can be selected from the transparent materials listed above as well as materials which are not transparent such as metals or semiconductors materials like silicon wafers.

For the case of the bottom emitting device, as shown, first electrodes 110a, 110b, 110c, 110d, and 110e are arranged to transmit light and are preferably constructed of a conductive transparent material such as indium tin oxide (ITO) or indium zinc oxide (IZO). Second electrode 130 is preferably constructed of a reflective conductive material such as aluminum, silver, magnesium silver alloy, or the like. These electrodes can be constructed of a single layer or of multiple layers in order to achieve the desired light absorption or reflection properties, conductivity properties, and carrier injection properties. For the alternate case of a top emitting device, it is preferable that the second electrode is transparent and the first electrode is reflective. In the case of a top emitting device, color filters 140a and 140e would be disposed in the path of the light on the side of the second electrode. While the first electrodes are shown as being arranged in the column direction and the second electrode is shown as being arranged in the row direction, the opposite arrangement is also possible.

While not always necessary, it is often useful that a hole-injecting layer (not shown) be formed and disposed over first electrodes 110a, 110b, 110c, 110d, and 110e. The hole-injecting material can serve to improve the film formation property of subsequent organic layers and to facilitate injection of holes into the hole-transporting layer. Suitable materials for use in the hole-injecting layer include, but are not limited to, porphyrinic compounds as described in U.S. Pat. No. 4,720,432, plasma-deposited fluorocarbon polymers as described in U.S. Pat. No. 6,208,075, and inorganic oxides including vanadium oxide ($VO_x$), molybdenum oxide ($MoO_x$), and nickel oxide ($NiO_x$). Alternative hole-injecting materials reportedly useful in organic EL devices are described in EP 0 891 121 A1 and EP 1 029 909 A1.

While not always necessary, it is often useful that a hole-transporting layer 122 be formed and disposed over first electrodes 110a, 110b, 110c, 110d, and 110e. Hole-transporting materials useful in hole-transporting layer 122 are well known to include compounds such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. in U.S. Pat. No. 3,180,730. Other suitable triarylamines substituted with one or more vinyl radicals and/or comprising at least one active hydrogen-containing group are disclosed by Brantley et al. in U.S. Pat. Nos. 3,567,450 and 3,658,520.

A more preferred class of aromatic tertiary amines is those which include at least two aromatic tertiary amine moieties as described in U.S. Pat. Nos. 4,720,432 and 5,061,569. Such compounds include those represented by structural Formula A

A wherein:

$Q_1$ and $Q_2$ are independently selected aromatic tertiary amine moieties; and G is a linking group such as an arylene, cycloalkylene, or alkylene group of a carbon to carbon bond.

In one embodiment, at least one of $Q_1$ or $Q_2$ contains a polycyclic fused ring structure, e.g., a naphthalene moiety. When G is an aryl group, it is conveniently a phenylene, biphenylene, or naphthalene moiety.

A useful class of triarylamines satisfying structural Formula A and containing two triarylamine moieties is represented by structural Formula B

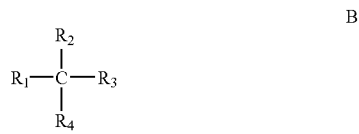

B wherein:

$R_1$ and $R_2$ each independently represent a hydrogen atom, an aryl group, or an alkyl group or $R_1$ and $R_2$ together represent the atoms completing a cycloalkyl group; and $R_3$ and $R_4$ each independently represent an aryl group, which is in turn substituted with a diaryl substituted amino group, as indicated by structural Formula C

C wherein $R_5$ and $R_6$ are independently selected aryl groups. In one embodiment, at least one of $R_5$ or $R_6$ contains a polycyclic fused ring structure, e.g., a naphthalene.

Another class of aromatic tertiary amines is the tetraaryldiamines. Desirable tetraaryldiamines include two diarylamino groups, such as indicated by Formula C, linked through an arylene group. Useful tetraaryldiamines include those represented by Formula D

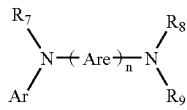

wherein:
  each Are is an independently selected arylene group, such as a phenylene or anthracene moiety;
  n is an integer of from 1 to 4; and
  Ar, $R_7$, $R_8$, and $R_9$ are independently selected aryl groups.

In a typical embodiment, at least one of Ar, $R_7$, $R_8$, and $R_9$ is a polycyclic fused ring structure, e.g., a naphthalene.

The various alkyl, alkylene, aryl, and arylene moieties of the foregoing structural Formulae A, B, C, D, can each in turn be substituted. Typical substituents include alkyl groups, alkoxy groups, aryl groups, aryloxy groups, and halides such as fluoride, chloride, and bromide. The various alkyl and alkylene moieties typically contain from 1 to about 6 carbon atoms. The cycloalkyl moieties can contain from 3 to about 10 carbon atoms, but typically contain five, six, or seven carbon atoms, e.g. cyclopentyl, cyclohexyl, and cycloheptyl ring structures. The aryl and arylene moieties are typically phenyl and phenylene moieties.

The hole-transporting layer in an OLED device can be formed of a single or a mixture of aromatic tertiary amine compounds. Specifically, one can employ a triarylamine, such as a triarylamine satisfying the Formula B, in combination with a tetraaryldiamine, such as indicated by Formula D. When a triarylamine is employed in combination with a tetraaryldiamine, the latter is positioned as a layer interposed between the triarylamine and the electron injecting and transporting layer. Illustrative of useful aromatic tertiary amines are the following:
  1,1-Bis(4-di-p-tolylaminophenyl)cyclohexane;
  1,1-Bis(4-di-p-tolylaminophenyl)-4-phenylcyclohexane;
  4,4'-Bis(diphenylamino)quaterphenyl;
  Bis(4-dimethylamino-2-methylphenyl)-phenylmethane;
  Tri(p-tolyl)amine;
  4-(di-p-tolylamino)-4'-[4'-(di-p-tolylamino)-1-styryl]stilbene;
  N,N,N',N'-Tetra-p-tolyl-4,4'-diaminobiphenyl;
  N,N,N',N'-Tetraphenyl-4,4'-diaminobiphenyl;
  N-Phenylcarbazole;
  Poly(N-vinylcarbazole);
  N,N'-di-1-naphthalenyl-N,N'-diphenyl-4,4'-diaminobiphenyl;
  4,4'-Bis[N-(1-naphthyl)-N-phenylamino]biphenyl (NPB);
  4,4'-Bis[N-(1-naphthyl)-N-(2-naphthyl)amino]biphenyl (TNB);
  4,4"-Bis[N-(1-naphthyl)-N-phenylamino]-p-terphenyl;
  4,4'-Bis[N-(2-naphthyl)-N-phenylamino]biphenyl;
  4,4'-Bis[N-(3-acenaphthenyl)-N-phenylamino]biphenyl;
  1,5-Bis[N-(1-naphthyl)-N-phenylamino]naphthalene;
  4,4'-Bis[N-(9-anthryl)-N-phenylamino]biphenyl;
  4,4"-Bis[N-(1-anthryl)-N-phenylamino]-p-terphenyl;
  4,4'-Bis[N-(2-phenanthryl)-N-phenylamino]biphenyl;
  4,4'-Bis[N-(8-fluoranthenyl)-N-phenylamino]biphenyl;
  4,4'-Bis[N-(2-pyrenyl)-N-phenylamino]biphenyl;
  4,4'-Bis[N-(2-naphthacenyl)-N-phenylamino]biphenyl;
  4,4'-Bis[N-(2-perylenyl)-N-phenylamino]biphenyl;
  4,4'-Bis[N-(1-coronenyl)-N-phenylamino]biphenyl;
  2,6-Bis(di-p-tolylamino)naphthalene;
  2,6-Bis[di-(1-naphthyl)amino]naphthalene;
  2,6-Bis[N-(1-naphthyl)-N-(2-naphthyl)amino]naphthalene;
  N,N,N',N'-Tetra(2-naphthyl)-4,4"'-diamino-p-terphenyl;
  4,4'-Bis{N-phenyl-N-[4-(1-naphthyl)-phenyl]amino}biphenyl;
  4,4'-Bis[N-phenyl-N-(2-pyrenyl)amino]biphenyl;
  2,6-Bis[N,N-di(2-naphthyl)amino]fluorene; and
  1,5-Bis[N-(1-naphthyl)-N-phenylamino]naphthalene.

Another class of useful hole-transporting materials includes polycyclic aromatic compounds as described in EP 1 009 041. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Light-emitting layers 123a, 123c, and 123d produce light in response to hole-electron recombination and are disposed over hole-transporting layer 122, although hole-transporting layer 122 is not required for the practice of this invention. Useful organic light-emitting materials are well known. As more fully described in U.S. Pat. Nos. 4,769,292 and 5,935,721, each of the light-emitting layers of the organic EL element includes a luminescent or fluorescent material where electroluminescence is produced as a result of electron-hole pair recombination in this region. While light-emitting layers can be comprised of a single material, they more commonly include a host material doped with a guest compound or dopant where light emission comes primarily from the dopant. The practice of this invention concerns such host/dopant light-emitting layers and OLED devices. Light-emitting layer 123a includes a first host, light-emitting layer 123c includes a second host, and light-emitting layer 123d includes a third host. Any two of the hosts, e.g. the second and third hosts, or all of the hosts, can be the same material. Any of the hosts can comprise a single host material or a mixture of host materials. The dopant is selected to produce colored light having a particular spectrum. The dopant is typically chosen from highly fluorescent dyes, and is typically coated as 0.01 to 10% by weight into the host material. Light-emitting layer 123a includes a light-emitting material of the first color, e.g. a blue or blue-green light-emitting material. Light-emitting layer 123c includes a light-emitting material of the second color, e.g. a green light-emitting material. Light-emitting layer 123d includes a light-emitting material of the third color, e.g. a yellow-orange or red-orange light-emitting material. The practice of this invention is not restricted to this ordering of layers. The host materials in the light-emitting layers can be an electron-transporting material, a hole-transporting material, or another material that supports hole-electron recombination. The dopant is typically chosen from highly fluorescent dyes, but phosphorescent compounds, e.g., transition metal complexes as described in WO 98/55561, WO 00/18851, WO 00/57676, and WO 00/70655 are also useful.

The host and emitting materials can be small nonpolymeric molecules or polymeric materials including polyfluorenes and polyvinylarylenes, e.g., poly(p-phenylenevinylene), PPV. In the case of polymers, small molecule emitting materials can be molecularly dispersed into a polymeric host, or the emitting materials can be added by copolymerizing a minor constituent into a host polymer.

Desirable host materials are capable of forming a continuous film. The light-emitting layer can contain more than one host material in order to improve the device's film morphology, electrical properties, light emission efficiency, and lifetime. The light-emitting layer can contain a first host material that has effective hole-transporting properties, and a second host material that has effective electron-transporting properties.

An important relationship for choosing a dye as a dopant is the value of the optical bandgap, which is defined the energy difference between the emissive excited state and the ground state of the molecule and is approximately equal to the energy difference between the lowest unoccupied molecular orbital and the highest occupied molecular orbital of the molecule. For efficient energy transfer from the host material to the dopant molecule, or to prevent back-transfer of energy from the dopant to the host, a necessary condition is that the band gap of the dopant be smaller than that of the host material.

Host and emitting molecules known to be of use include, but are not limited to, those disclosed in U.S. Pat. Nos. 4,768, 292, 5,141,671, 5,150,006, 5,151,629, 5,294,870, 5,405,709, 5,484,922, 5,593,788, 5,645,948, 5,683,823, 5,755,999, 5,928,802, 5,935,720, 5,935,721, 6,020,078, and 6,534,199.

Other organic emissive materials can be polymeric substances, e.g. polyphenylenevinylene derivatives, dialkoxy-polyphenylenevinylenes, poly-para-phenylene derivatives, and polyfluorene derivatives, as taught by Wolk et al. in commonly assigned U.S. Pat. No. 6,194,119 and references cited therein.

Suitable host materials for phosphorescent emitters (including materials that emit from a triplet excited state, i.e. so-called "triplet emitters") should be selected so that the triplet exciton can be transferred efficiently from the host material to the phosphorescent material. For this transfer to occur, it is a highly desirable condition that the excited state energy of the phosphorescent material be lower than the difference in energy between the lowest triplet state and the ground state of the host. However, the band gap of the host should not be chosen so large as to cause an unacceptable increase in the drive voltage of the OLED. Suitable host materials are described in WO 00/70655 A2, WO 01/39234 A2, WO 01/93642 A1, WO 02/074015 A2, WO 02/15645 A1, and U.S. Patent Application Publication 2002/0117662 A1. Suitable hosts include certain aryl amines, triazoles, indoles and carbazole compounds. Examples of desirable hosts are 4,4'-N,N'-dicarbazole-biphenyl (CBP), 2,2'-dimethyl-4,4'-(N,N'-dicarbazole)-biphenyl, m-(N,N'-dicarbazole)benzene, and poly(N-vinylcarbazole), including their derivatives.

In addition to suitable hosts, an OLED device employing a phosphorescent material often requires at least one exciton- or hole-blocking layer to help confine the excitons or electron-hole recombination centers to the light-emitting layer comprising the host and phosphorescent material. In one embodiment, such a blocking layer would be placed between a phosphorescent light-emitting layer and the cathode, and in contact with the phosphorescent light-emitting layer. In this case, the ionization potential of the blocking layer should be such that there is an energy barrier for hole migration from the host into the electron-transporting layer (or the metal-doped organic layer), while the electron affinity should be such that electrons pass more readily from the electron-transporting layer (or the metal-doped organic layer) into the light-emitting layer comprising host and phosphorescent material. It is further desired, but not absolutely required, that the triplet energy of the blocking material be greater than that of the phosphorescent material. Suitable hole-blocking materials are described in WO 00/70655 A2 and WO 01/93642 A1. Two examples of useful materials are bathocuproine (BCP) and bis(2-methyl-8-quinolinolato)(4-phenylphenolato)-Aluminum(III) (BAlQ). Metal complexes other than Balq are also known to block holes and excitons as described in U.S. Patent Application Publication 2003/0068528 A1. U.S. Patent Application Publication 2003/0175553 A1 describes the use of fac-tris(1-phenylpyrazolato-N,C²)iridium(III) (Irppz) in an electron/exciton blocking layer.

Light-emitting layer 123a includes a host material, or mixture of hosts, and a light-emitting material. Light-emitting layer 123a preferably has a peak emission in the blue to blue-green portion of the visible spectrum. In one embodiment, the host material is one or more anthracene or monoanthracene derivatives. Derivatives of 9,10-di-(2-naphthyl) anthracene (Formula F) constitute one class of hosts useful in light-emitting layer 123a

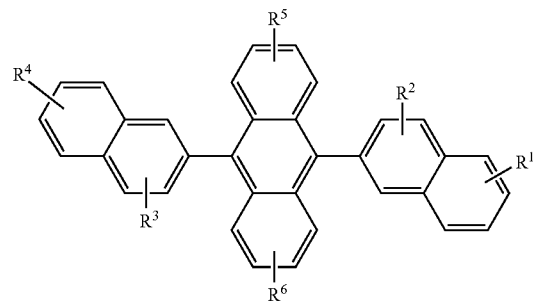

F wherein:
  $R^1$, $R^2$, $R^3$, $R^4$, $R^5$, and $R^6$ represent one or more substituents on each ring where each substituent is individually selected from the following groups:
  Group 1: hydrogen, or alkyl of from 1 to 24 carbon atoms;
  Group 2: aryl or substituted aryl of from 5 to 20 carbon atoms;
  Group 3: carbon atoms from 4 to 24 necessary to complete a fused aromatic ring of anthracenyl; pyrenyl, or perylenyl;
  Group 4: heteroaryl or substituted heteroaryl of from 5 to 24 carbon atoms as necessary to complete a fused heteroaromatic ring of furyl, thienyl, pyridyl, quinolinyl or other heterocyclic systems;
  Group 5: alkoxylamino, alkylamino, or arylamino of from 1 to 24 carbon atoms; and
  Group 6: fluorine, chlorine, bromine or cyano.

Benzazole derivatives (Formula G) constitute another class of hosts useful in light-emitting layer 123a

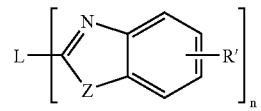

G wherein:
  n is an integer of 3 to 8;
  Z is O, NR or S;
  R' is hydrogen; alkyl of from 1 to 24 carbon atoms, for example, propyl, t-butyl, heptyl, and the like; aryl or hetero-atom substituted aryl of from 5 to 20 carbon atoms for example phenyl and naphthyl, furyl, thienyl, pyridyl, quinolinyl and other heterocyclic systems; or halo such as chloro, fluoro; or atoms necessary to complete a fused aromatic ring; and L is a linkage unit including alkyl, aryl, substituted alkyl, or substituted aryl, which conjugately or unconjugately connects the multiple benzazoles together.

An example of a useful benzazole is 2, 2', 2''-(1,3,5-phenylene)tris-[1-phenyl-1H-benzimidazole].

It has been found in commonly assigned U.S. patent application Ser. No. 10/950,614 filed Sep. 27, 2004 by Lelia Cosimbescu et al., entitled "Electroluminescent Device With Anthracene Derivative Host", a continuation-in-part of U.S. patent application Ser. No. 10/693,121 filed Oct. 24, 2003, now abandoned, the disclosure of which is herein incorporated by reference, that certain unsymmetrical anthracenes are extremely useful in OLED devices that exhibit high efficiencies. These compounds have been found to be particularly useful in blue light-emitting layers of OLED devices that produce blue, blue-green, or green light. Blue or blue-green light-emitting layer 123a can include a mono-anthracene derivative of Formula (I) as a host material

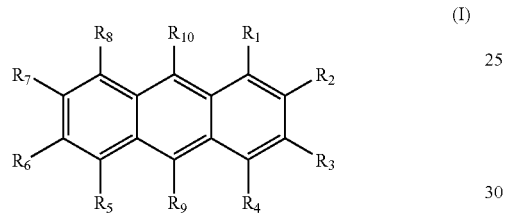

(I)

wherein:

$R_1$-$R_8$ are H; and $R_9$ is a naphthyl group containing no fused rings with aliphatic carbon ring members; provided that $R_9$ and $R_{10}$ are not the same, and are free of amines and sulfur compounds. Suitably, $R_9$ is a substituted naphthyl group with one or more further fused rings such that it forms a fused aromatic ring system, including a phenanthryl, pyrenyl, fluoranthene, perylene, or substituted with one or more substituents including fluorine, cyano group, hydroxy, alkyl, alkoxy, aryloxy, aryl, a heterocyclic oxy group, carboxy, trimethylsilyl group, or an unsubstituted naphthyl group of two fused rings. Conveniently, $R_9$ is 2-naphthyl, or 1-naphthyl substituted or unsubstituted in the para position; and $R_{10}$ is a biphenyl group having no fused rings with aliphatic carbon ring members. Suitably $R_{10}$ is a substituted biphenyl group, such that it forms a fused aromatic ring system including but not limited to a naphthyl, phenanthryl, perylene, or substituted with one or more substituents including fluorine, cyano group, hydroxy, alkyl, alkoxy, aryloxy, aryl, a heterocyclic oxy group, carboxy, trimethylsilyl group, or an unsubstituted biphenyl group. Conveniently, $R_{10}$ is 4-biphenyl, 3-biphenyl unsubstituted or substituted with another phenyl ring without fused rings to form a terphenyl ring system, or 2-biphenyl. Particularly useful is 9-(2-naphthyl)-10-(4-biphenyl)anthracene.

Some examples of useful mono-anthracene host materials for use in light-emitting layer 123a include:

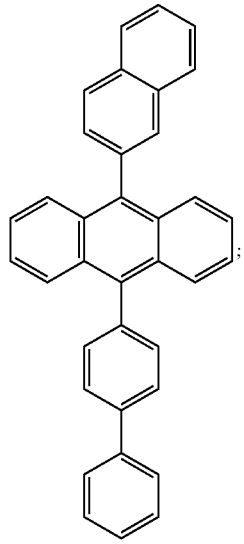

Host-1

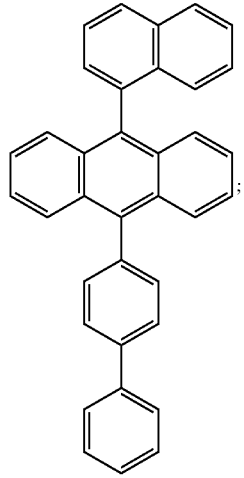

Host-2

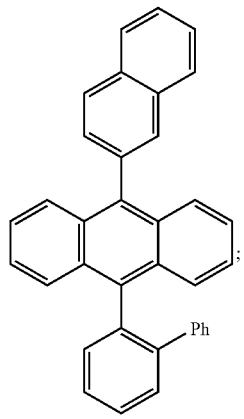

Host-3

Host-4
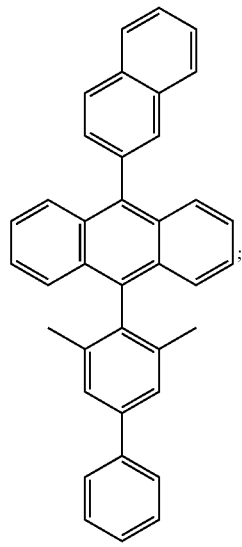
Host-5
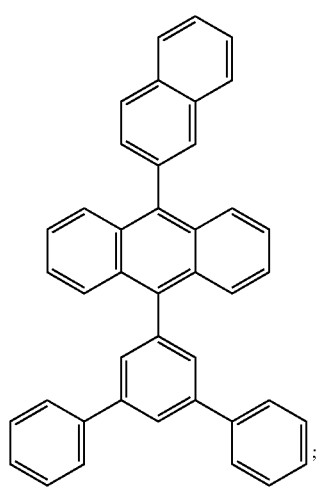
Host-6
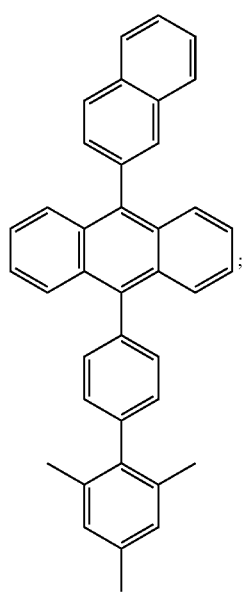
Host-7
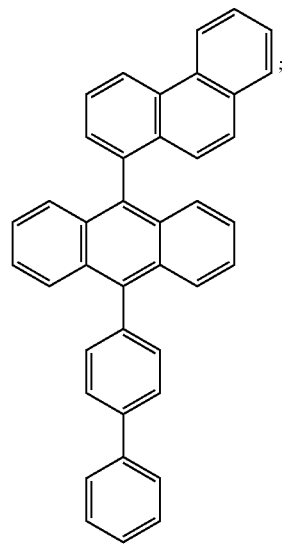
Host-8
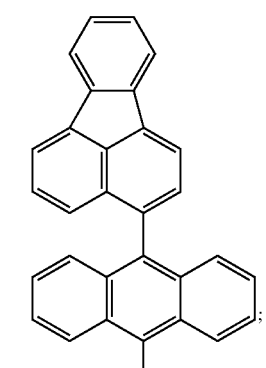
Host-9
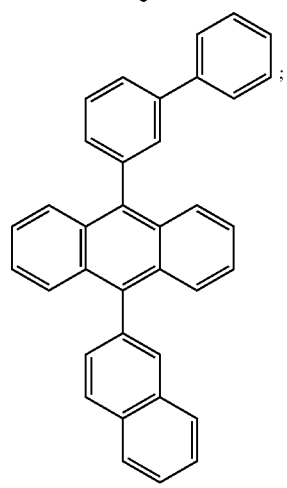

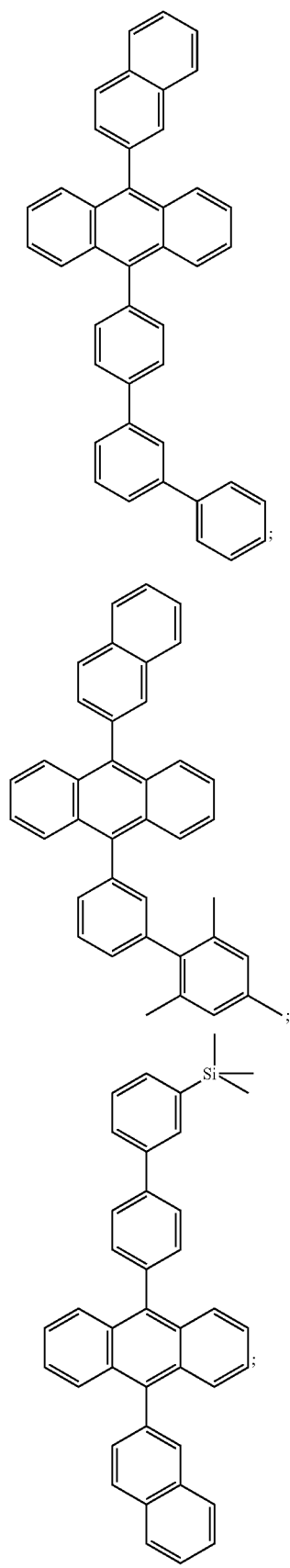
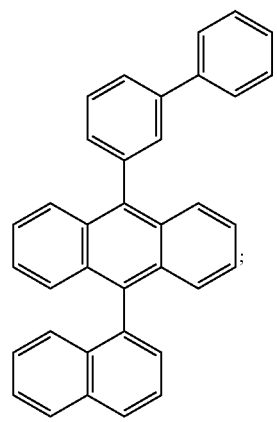
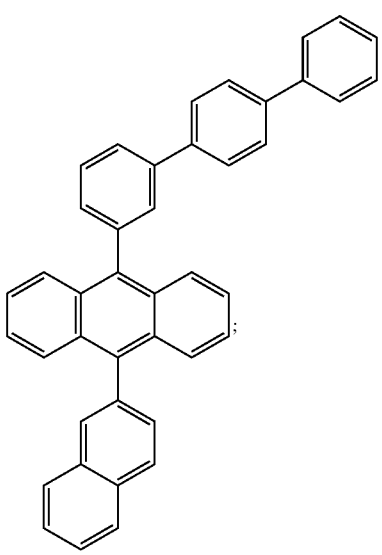
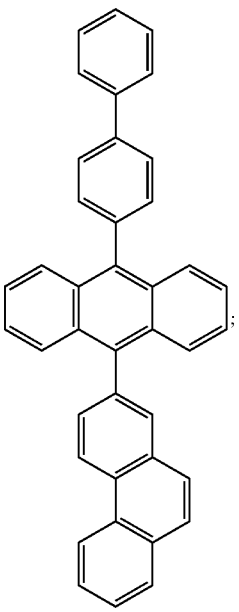

Host19
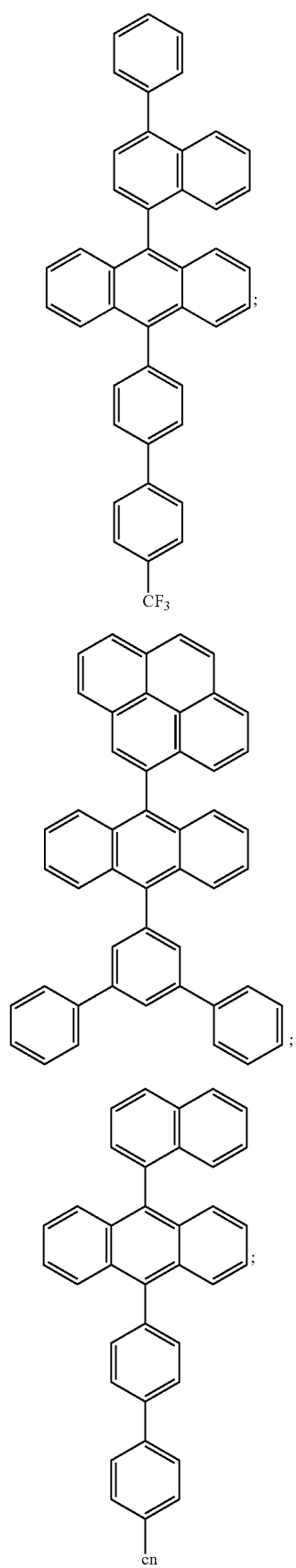
Host20
Host-21
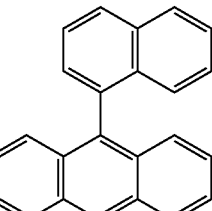
Host-22
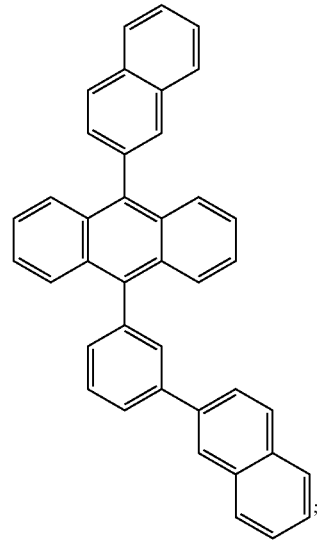
Host-23
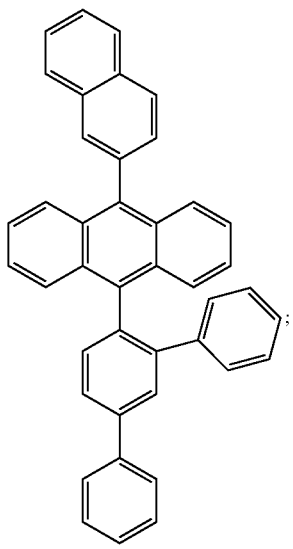
Host-24
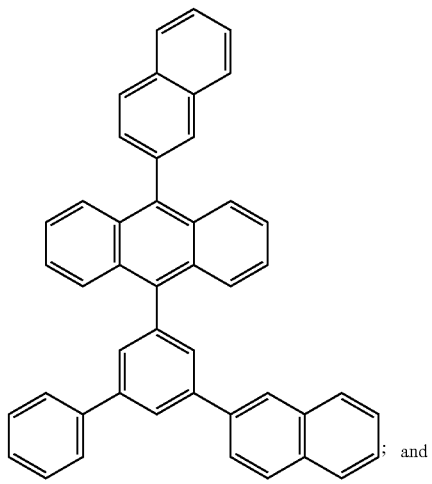
; and Host-25

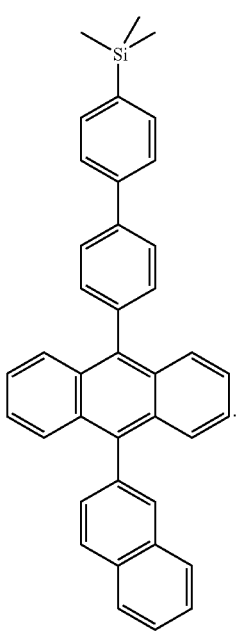

Host-16

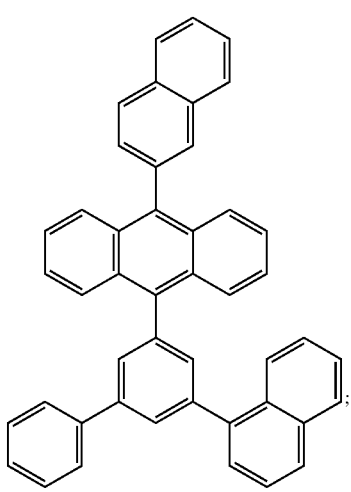

Host-17

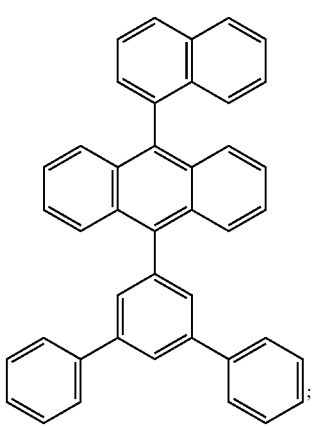

Host-18

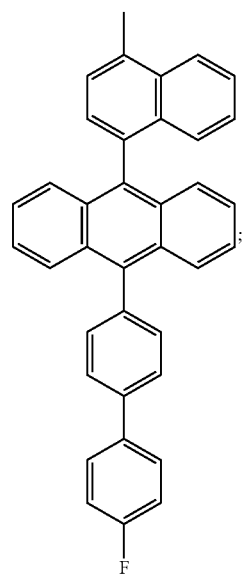

Particularly useful is 9-(2-naphthyl)-10-(4-biphenyl)anthracene (Host-1).

In a preferred embodiment, the host material in light-emitting layer 123a can include a mixture of one or more anthracene or mono-anthracene derivatives mentioned above, and one or more aromatic amine derivatives. The aromatic amine derivative in light-emitting layer 123a can be any such amine that has hole-transporting properties, and can be selected from the same potential hole-transporting materials as in hole-transporting layer 122. Particularly useful is 4,4'-Bis[N-(1-naphthyl)-N-phenylamino]biphenyl (NPB).

The light-emitting material in light-emitting layer 123a has a peak emission in the blue to blue-green portion of the visible spectrum, and can include blue or blue-green emitting derivatives of such distyrylarenes as distyrylbenzene and distyrylbiphenyl, including compounds described in U.S. Pat. No. 5,121,029. Among derivatives of distyrylarenes that provide blue or blue-green luminescence, particularly useful are those substituted with diarylamino groups, also known as distyrylamines. Examples include bis[2-[4-[N,N-diarylamino]phenyl]vinyl]-benzenes of the general structure N1 shown below:

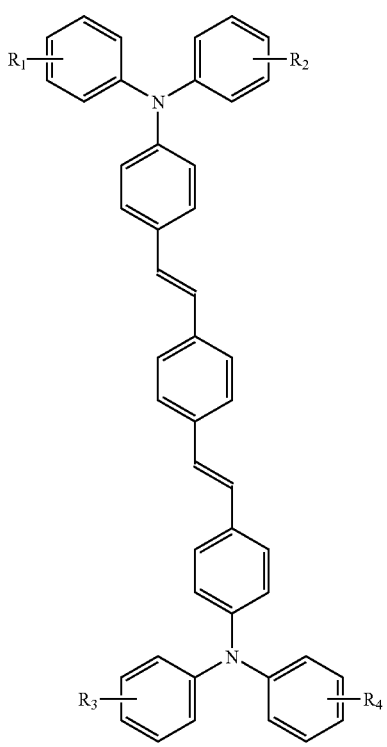

and bis[2-[4-[N,N-diarylamino]phenyl]vinyl]biphenyls of the general structure N2 shown below:

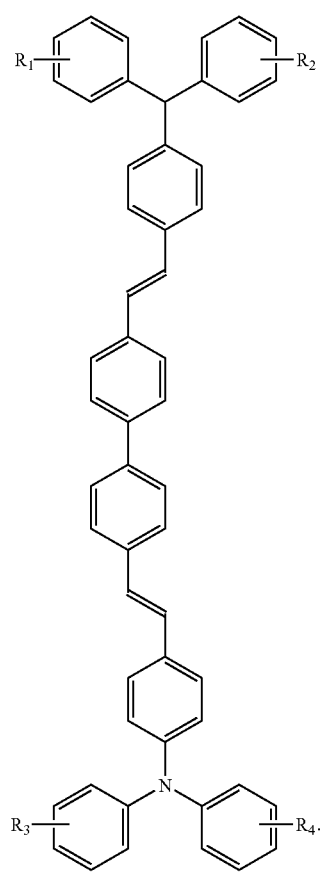

In Formulas N1 and N2, $R_1$-$R_4$ can be the same or different, and individually represent one or more substituents such as alkyl, aryl, fused aryl, halo, or cyano. In a preferred embodiment, $R_1$-$R_4$ are individually alkyl groups, each containing from one to about ten carbon atoms. A particularly useful blue or blue-green dopant of this class is 1,4-bis[2-[4-[N,N-di(p-tolyl)amino]phenyl]vinyl]benzene (BDTAPVB)

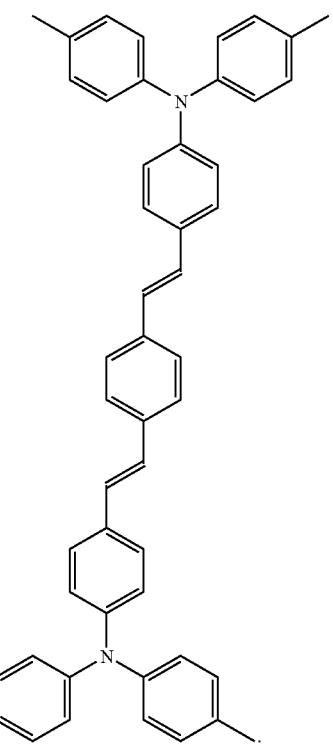

In a particularly desirable embodiment of the invention, light-emitting layer 123a includes a blue or blue-green dopant of Formula (3)

Formula (3)

wherein $R^1$ through $R^4$ can be the same or different and individually represent hydrogen or one or more substituents, for example, alkyl groups, such as methyl groups, alkoxy groups, such as methoxy, aryl groups, such as phenyl, or aryloxy groups, such as phenoxy.

Particularly useful embodiments of the blue or blue-green emissive dopants of light-emitting layer 123a are shown in Formula (4-1) through Formula (4-5)

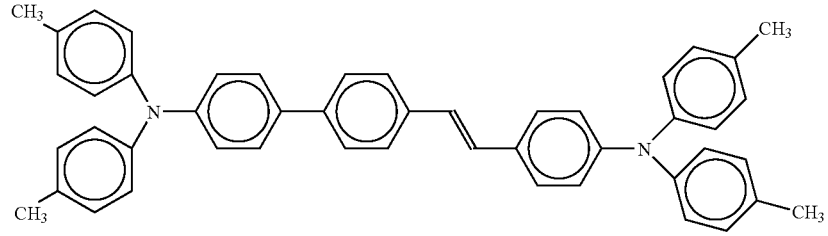
Formula (4-1)
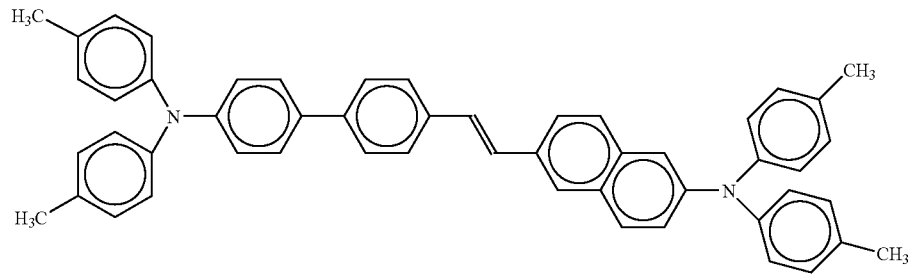
Formula (4-2)
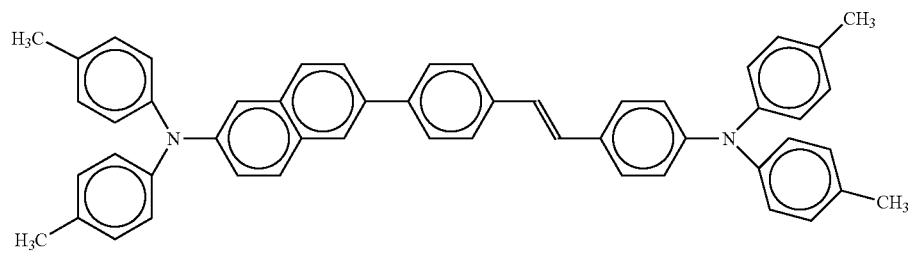
Formula (4-3)
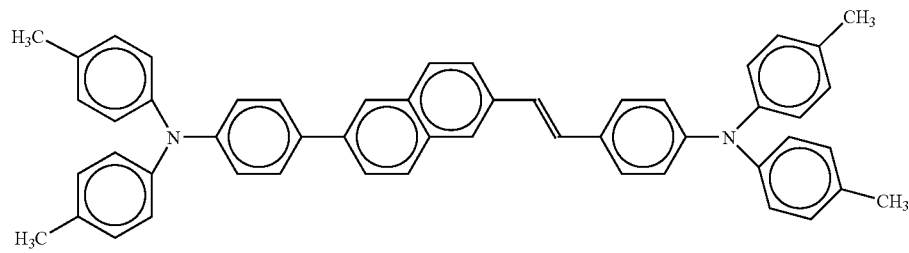
Formula (4-4)
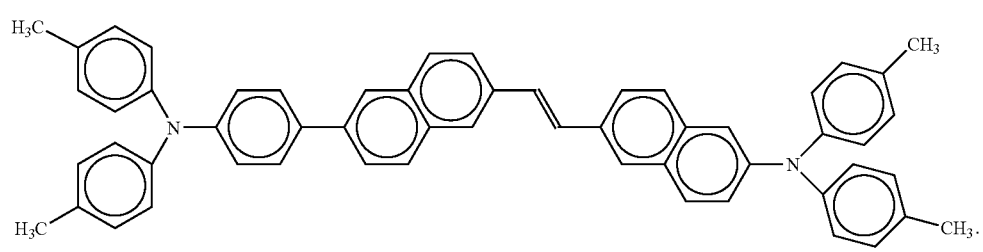
Formula (4-5)

Light-emitting layer 123*c* includes a host material, or mixture of hosts, and a light-emitting material. Light-emitting layer 123*c* has a peak emission in the green portion of the visible spectrum. In one embodiment, the host material is one or more anthracene or mono-anthracene derivatives such as those described as useful in light-emitting layer 123*a*, or one or more electron-transporting materials. Electron-transporting materials useful as host materials including metal complexes of 8-hydroxyquinoline and similar derivatives (Formula E) constitute one class of host compounds useful in light-emitting layer 123*c*

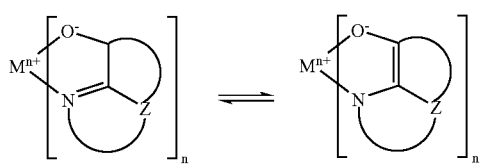

E wherein:

M represents a metal;

n is an integer of from 1 to 3; and

Z independently in each occurrence represents the atoms completing a nucleus having at least two fused aromatic rings.

From the foregoing it is apparent that the metal can be monovalent, divalent, or trivalent metal. The metal can, for example, be an alkali metal, such as lithium, sodium, or potassium; an alkaline earth metal, such as magnesium or calcium; or an earth metal, such as boron or aluminum. Generally any monovalent, divalent, or trivalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is typically maintained at 18 or less.

Illustrative of useful chelated oxinoid compounds are the following:

CO-1: Aluminum trisoxine [alias, tris(8-quinolinolato)aluminum(III)];

CO-2: Magnesium bisoxine [alias, bis(8-quinolinolato) magnesium(II)];

CO-3: Bis[benzo{f}-8-quinolinolato]zinc (II);

CO-4: Bis(2-methyl-8-quinolinolato)aluminum(III)-µ-oxo-bis(2-methyl-8-quinolinolato) aluminum(III);

CO-5: Indium trisoxine [alias, tris(8-quinolinolato)indium];

CO-6: Aluminum tris(5-methyloxine) [alias, tris(5-methyl-8-quinolinolato) aluminum(III)];

CO-7: Lithium oxine [alias, (8-quinolinolato)lithium(I)];

CO-8: Gallium oxine [alias, tris(8-quinolinolato)gallium (III)]; and

CO-9: Zirconium oxine [alias, tetra(8-quinolinolato)zirconium(IV)].

In a preferred embodiment, the host material in light-emitting layer 123*c* can include a mixture of one or more anthracene or mono-anthracene derivatives such as those described as useful in light-emitting layer 123*a*, and one or more electron-transporting materials.

The light-emitting material in light-emitting layer 123*c* has a peak emission in the green portion of the visible spectrum, and can include a quinacridone compound of the following structure:

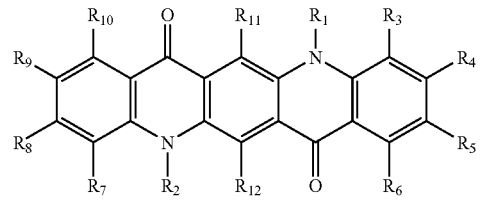

wherein:

substituent groups $R_1$ and $R_2$ are independently alkyl, alkoxyl, aryl, or heteroaryl; and substituent groups $R_3$ through $R_{12}$ are independently hydrogen, alkyl, alkoxyl, halogen, aryl, or heteroaryl, and adjacent substituent groups $R_3$ through $R_{10}$ can optionally be connected to form one or more ring systems, including fused aromatic and fused heteroaromatic rings, provided that the substituents are selected to provide a full width at half maximum of between 5 nm and 70 nm contained within the wavelength range of 490 nm and 580 nm. Alkyl, alkoxyl, aryl, heteroaryl, fused aromatic ring and fused heteroaromatic ring substituent groups can be further substituted. Conveniently, $R_1$ and $R_2$ are aryl, and $R_3$ through $R_{12}$ are hydrogen, or substituent groups that are more electron withdrawing than methyl. Some examples of useful quinacridones include those disclosed in U.S. Pat. No. 5,593,788 and in U.S. Patent Application Publication 2004/0001969 A1.

Examples of useful quinacridone green dopants include:

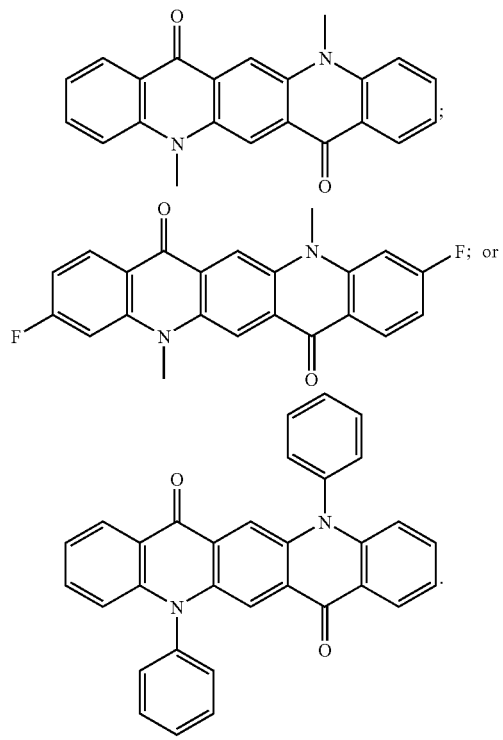

The green-light-emitting material in layer 123c can include a coumarin compound of the following structure:

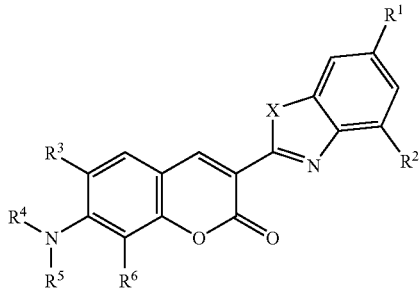

wherein:
X is O or S, $R^1$, $R^2$, $R^3$ and $R^6$ can individually be hydrogen, alkyl, or aryl; and
$R^4$ and $R^5$ can individually be alkyl or aryl, or where either $R^3$ and $R^4$, or $R^5$ and $R^6$, or both together represent the atoms completing a cycloalkyl group, provided that the substituents are selected to provide a full width at half maximum of between 5 nm and 70 nm contained within the wavelength range of 490 nm and 580 nm.

Examples of useful coumarin green dopants include:

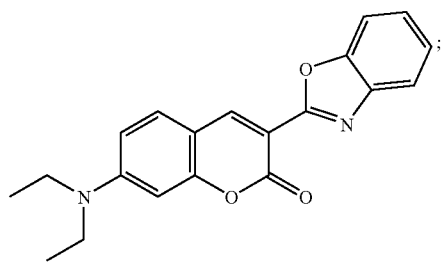

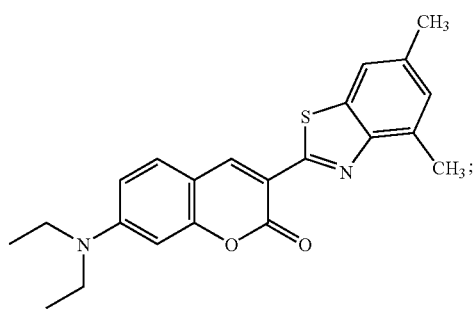

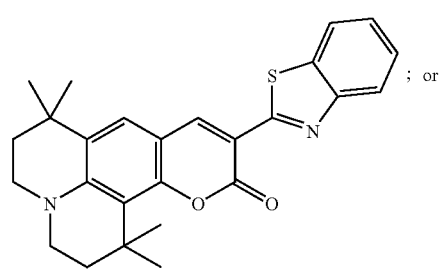

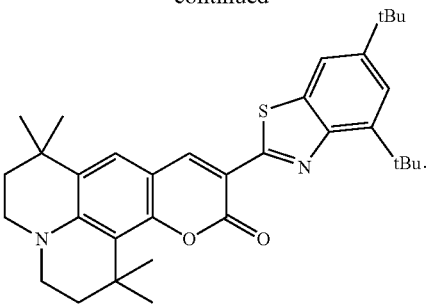

Light-emitting layer 123d includes a host material, or mixture of hosts, and a light-emitting material. In one embodiment, the host material is one or more electron-transporting materials selected from the same potential materials described as useful in light-emitting layer 123c, or one or more tetracene derivatives. Examples of tetracene derivatives useful as co-hosts in light-emitting layer 123d are:

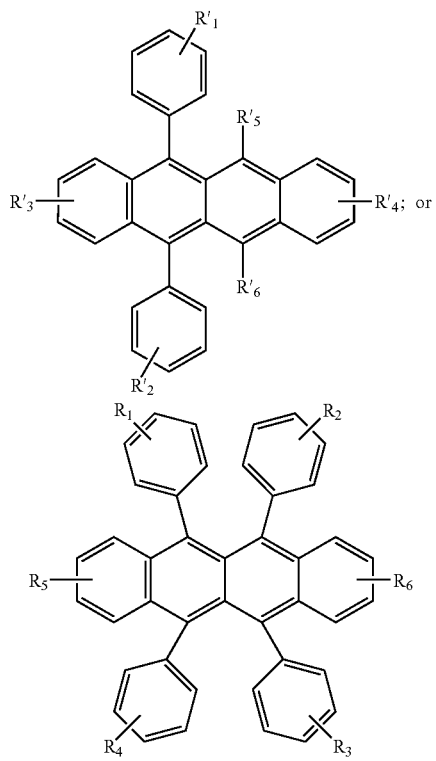

wherein $R_1$-$R_6$ represent one or more substituents on each ring and where each substituent is individually selected from one of the following:
Category 1: hydrogen, or alkyl of from 1 to 24 carbon atoms;
Category 2: aryl or substituted aryl of from 5 to 20 carbon atoms;
Category 3: hydrocarbon containing 4 to 24 carbon atoms, completing a fused aromatic ring or ring system;
Category 4: heteroaryl or substituted heteroaryl of from 5 to 24 carbon atoms such as thiazolyl, furyl, thienyl, pyridyl, quinolinyl or other heterocyclic systems, which are bonded via a single bond, or complete a fused heteroaromatic ring system;

Category 5: alkoxylamino, alkylamino, or arylamino of from 1 to 24 carbon atoms; or Category 6: fluoro, chloro, bromo or cyano.

In a preferred embodiment, the host material can include a mixture of one or more tetracene derivatives, and one or more electron-transporting materials.

The light-emitting material in light-emitting layer 123d has a peak emission in the yellow to red portion of the visible spectrum, and can include a yellow-orange or red-orange light-emitting compound of the following structures:

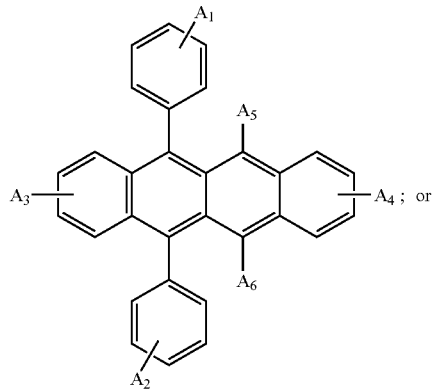

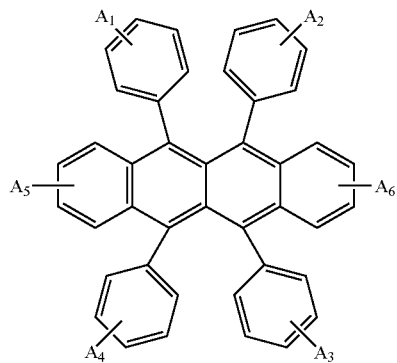

wherein $A_1$-$A_6$ represent one or more substituents on each ring and where each substituent is individually selected from one of the following:

Category 1: hydrogen, or alkyl of from 1 to 24 carbon atoms;

Category 2: aryl or substituted aryl of from 5 to 20 carbon atoms;

Category 3: hydrocarbon containing 4 to 24 carbon atoms, completing a fused aromatic ring or ring system;

Category 4: heteroaryl or substituted heteroaryl of from 5 to 24 carbon atoms such as thiazolyl, furyl, thienyl, pyridyl, quinolinyl or other heterocyclic systems, which are bonded via a single bond, or complete a fused heteroaromatic ring system;

Category 5: alkoxylamino, alkylamino, or arylamino of from 1 to 24 carbon atoms; or Category 6: fluoro, chloro, bromo or cyano.

Examples of particularly useful yellow-orange dopants for use in light-emitting layer 123d include 5,6,11,12-tetraphenylnaphthacene (P1); 6,11-diphenyl-5,12-bis(4-(6-methylbenzothiazol-2-yl)phenyl)naphthacene (P2); 5,6,11,12-tetra (2-naphthyl)naphthacene (P3); and compounds L49 and L50, the formulas of which are shown below:

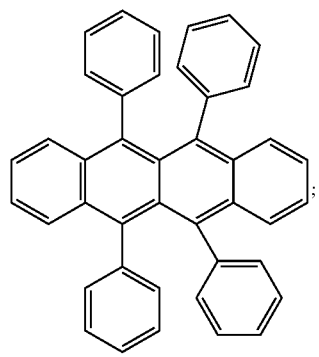

(P1)

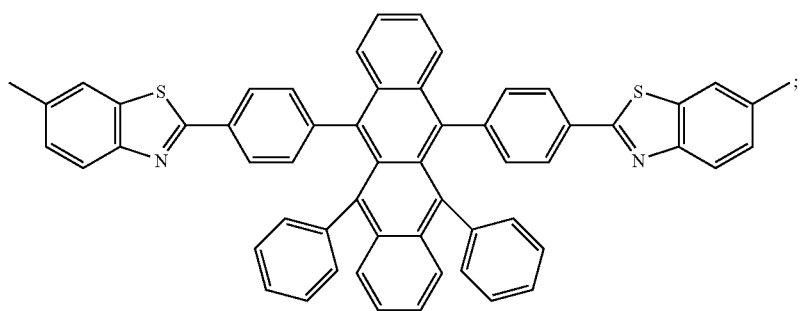
(P2)
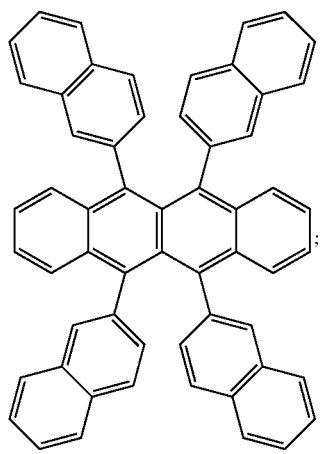
(P3)
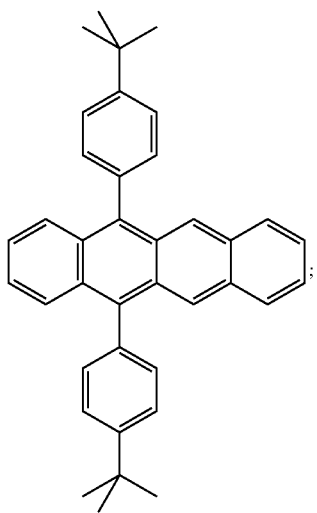
(P4)
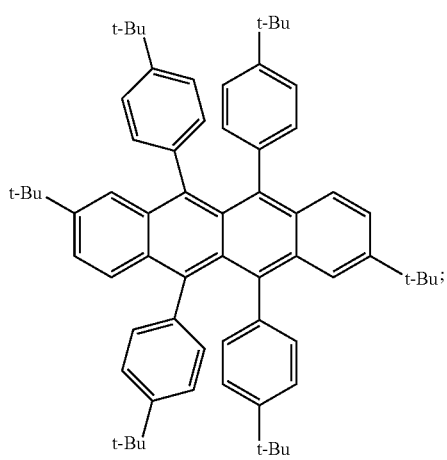
(L49)
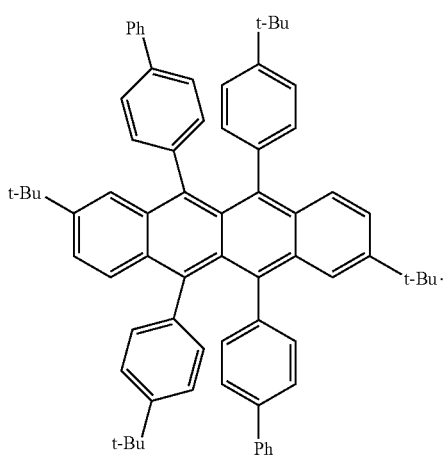
(L50)

A suitable yellow-orange dopant can also be a mixture of compounds that would also be yellow-orange dopants individually.

While not always necessary, it is often useful that an organic layer is formed over light-emitting layers 123a, 123c, and 123d, wherein the organic layer includes an electron-transporting material, e.g. electron-transporting layer 124. Preferred electron-transporting materials for use in electron-transporting layer 124 are metal chelated oxinoid compounds, including chelates of oxine itself (also commonly referred to as 8-quinolinol or 8-hydroxyquinoline). Such compounds help to inject and transport electrons and both exhibit high levels of performance and are readily fabricated in the form of thin films. Exemplary of contemplated oxinoid compounds are those satisfying structural Formula E

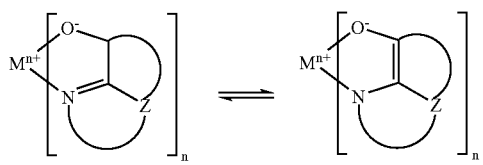

E wherein:
M represents a metal;
n is an integer of from 1 to 3; and
Z independently in each occurrence represents the atoms completing a nucleus having at least two fused aromatic rings.

From the foregoing it is apparent that the metal can be a monovalent, divalent, or trivalent metal. The metal can, for example, be an alkali metal, such as lithium, sodium, or potassium; an alkaline earth metal, such as beryllium, magnesium or calcium; or an earth metal, such as boron or aluminum. Generally any monovalent, divalent, or trivalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is typically maintained at 18 or less.

Illustrative of useful chelated oxinoid compounds are the following:

CO-1: Aluminum trisoxine [alias, tris(8-quinolinolato)aluminum(III)];
CO-2: Magnesium bisoxine [alias, bis(8-quinolinolato) magnesium(II)];
CO-3: Bis[benzo{f}-8-quinolinolato]zinc (II);
CO-4: Bis(2-methyl-8-quinolinolato)aluminum(III)-µ-oxo-bis(2-methyl-8-quinolinolato) aluminum(III);
CO-5: Indium trisoxine [alias, tris(8-quinolinolato)indium];
CO-6: Aluminum tris(5-methyloxine) [alias, tris(5-methyl-8-quinolinolato) aluminum(III)];
CO-7: Lithium oxine [alias, (8-quinolinolato)lithium(I)];
CO-8: Gallium oxine [alias, tris(8-quinolinolato)gallium (III)]; and
CO-9: Zirconium oxine [alias, tetra(8-quinolinolato)zirconium(IV)].

Other electron-transporting materials include various butadiene derivatives as disclosed in U.S. Pat. No. 4,356,429 and various heterocyclic optical brighteners as described in U.S. Pat. No. 4,539,507. Benzazoles satisfying structural Formula G are also useful electron-transporting materials.

Other electron-transporting materials can be polymeric substances, e.g. polyphenylenevinylene derivatives, poly-para-phenylene derivatives, polyfluorene derivatives, polythiophenes, polyacetylenes, and other conductive polymeric organic materials such as those listed in *Handbook of Conductive Molecules and Polymers*, Vols. 1-4, H. S. Nalwa, ed., John Wiley and Sons, Chichester (1997).

An electron-injecting layer (not shown) can also be present between the cathode and the electron-transporting layer. Examples of electron-injecting materials include alkali or alkaline earth metals, alkali halide salts, such as LiF mentioned above, or alkali or alkaline earth metal doped organic layers.

Desired organic materials for the hole-transporting layer 122, light-emitting layers 123a, 123c, and 123d, and electron-transporting layer 124 can be deposited and patterned by any one or more of several methods known in the art.

For example, organic materials can be deposited by thermal evaporation from a heated source and pattern achieved by selectively blocking deposition by use of a shadow masking structure. Alternately, the materials can first be deposited onto a donor sheet, which is then placed in contact or in proximity to the display substrate and the materials can be selectively transferred by writing with a laser. Alternately, some materials can be dissolved in a solvent and then selectively deposited on the substrate in the desired location by placing droplets of the solution by drop ejecting apparatus such as an ink jet head.

The device can further include an encapsulation means (not shown) for preventing moisture from the environment from degrading the device as is known in the art. The encapsulation means can be a glass or metal cover hermetically sealed to the substrate or can be a thin film of moisture impermeable material coated over the pixels. The encapsulation means can further include a desiccant for absorbing moisture.

Figure 5:
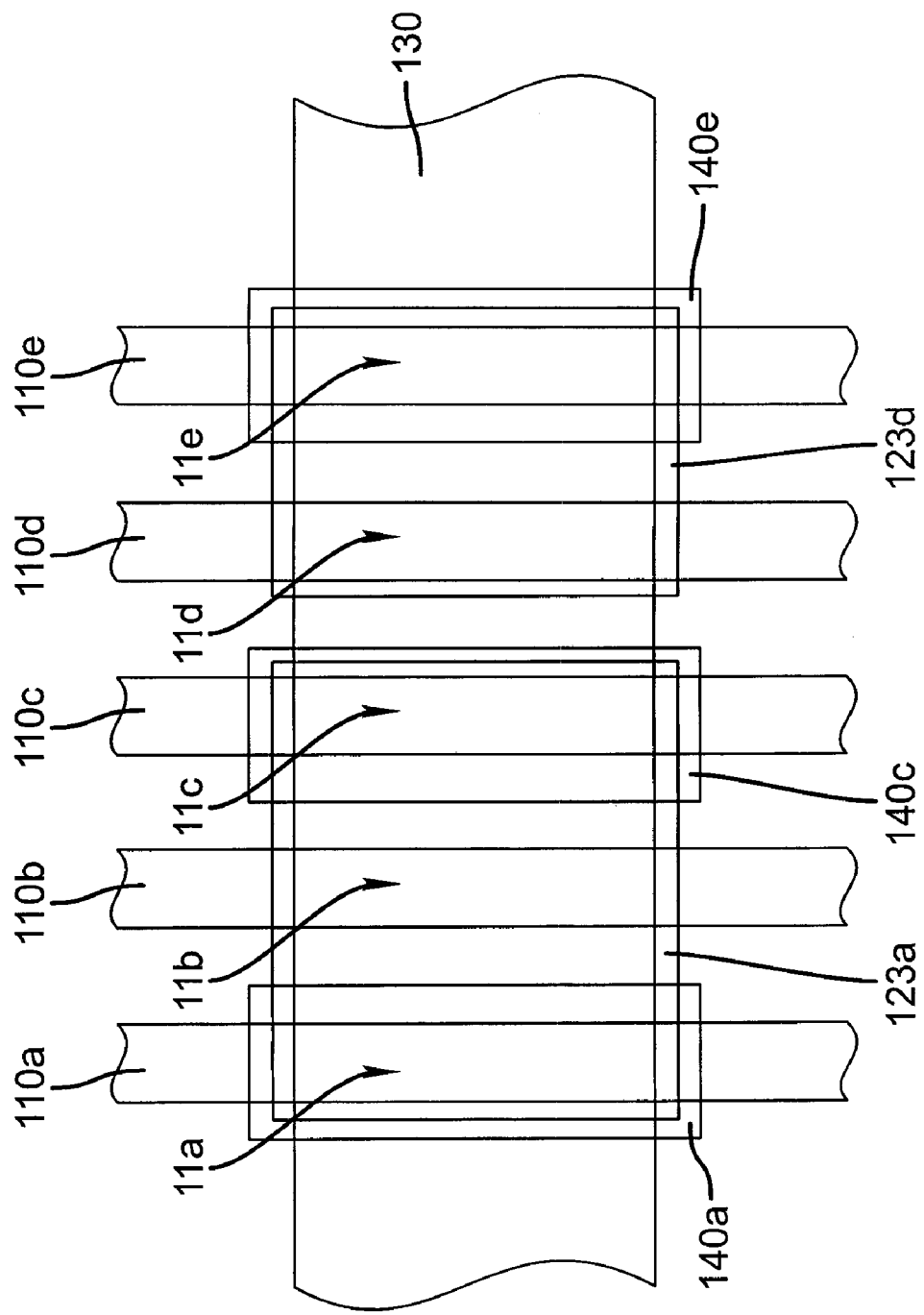
FIG. 5 shows a top side view of a pixel according to the second embodiment of the present invention.

FIG. 5 shows a top side view of an OLED display according to the second embodiment of the present invention. In the second embodiment, a common light-emitting layer, such as light-emitting layer 123a, is provided to be shared by three of the differently colored pixels, such as pixel 11a, pixel 11b, and pixel 11c. As such, light-emitting layer 123a needs to emit a spectra component corresponding to the wavelengths for the desired colors of 11a, pixel 11b, and pixel 11c. Pixel 11a, pixel 11b, and pixel 11c are preferably disposed adjacent to one other such that light-emitting layer 123a is continuously formed between these pixels. In the second embodiment, color filter 140c is formed in operational relationship to pixel 11c to filter the emission of this pixel to the desired color, which is different from pixel 11a and pixel 11b. As such, this second embodiment has the advantage that the five differently colored pixels can be formed by providing only two different light-emitting layers which require only two precision aligned depositions compared to the five required for prior art displays having five differently colored displays.

In this second embodiment, the three differently colored pixels sharing a common light-emitting layer can produce blue colored light emission, green colored light emission, and a color between blue and green. In this case, the blue and the green pixels would have color filters that pass blue and green light respectively and the pixel having the color between blue and green would remain unfiltered. The other two pixels can produce red light colored emission and a color between red and green with the red pixel having a color filter that passes red light.

Alternately, the three differently colored pixels sharing a common light-emitting layer can produce red colored light emission, green colored light emission, and a color between red and green. In this case, the red and the green pixels would have color filters that pass red and green light respectively and the pixel having the color between red and green would remain unfiltered. The other two pixels can produce blue light colored emission and a color between blue and green with the red pixel having a color filter that passes blue light.

The invention has been described in detail with particular reference to certain preferred embodiments thereof, but it will be understood that variations and modifications can be effected within the spirit and scope of the invention.

PARTS LIST 10 pixel group
11a pixel
11b pixel
11c pixel
11d pixel
11e pixel
12a chromaticity coordinate
12b chromaticity coordinate
12c chromaticity coordinate
12d chromaticity coordinate
12e chromaticity coordinate
100 substrate
110a first electrode
110b first electrode
110c first electrode
110d first electrode
110e first electrode
122 hole-transporting layer
123a light-emitting layer
123c light-emitting layer
123d light-emitting layer
124 electron-transporting layer
130 second electrode
140a color filter
140c color filter
140e color filter
210a external light emission
210b external light emission
210c external light emission
210d external light emission
210e external light emission
220a internal light emission
220b internal light emission
220c internal light emission
220d internal light emission
220e internal light emission

The invention claimed is:

1. A method of making an OLED display having at least first, second, and third differently colored pixels, comprising:
   a) providing a first common light-emitting layer having a first composition over a substrate continuously for the first and second pixels and providing a second light-emitting layer having a second composition different from the first composition over the substrate for the third pixel wherein the first and second light-emitting layers produce light having different spectra and the light produced by the first light-emitting layer has substantial spectral components corresponding to the light output desired for the first and second pixels; and
   b) forming a first color filter in operative relationship with the first pixel and no color filter corresponding to the second pixel.

2. A method of making an OLED display, comprising:
   a) providing at least first, second, third, and fourth differently colored pixels;
   b) providing a first common light-emitting layer having a first composition over a substrate continuously for the first and second pixels and providing a second light-emitting layer having a second composition different from the first composition over the substrate for the third pixel wherein the first and second light-emitting layers produce light having different spectra and the light produced by the first light-emitting layer has substantial spectral components corresponding to the light output desired for the first and second pixels; and
   c) forming a first color filter in operative relationship with the first pixel and no color filter corresponding to the second pixel.

3. The method according to claim 2 wherein the light spectrum produced by the first light-emitting layer has substantial components corresponding to blue and cyan.

4. The method according to claim 2 wherein the light spectrum produced by the second light-emitting layer has substantial components corresponding to red.

5. The method according to claim 2 wherein no color filter is provided corresponding to the third pixel.

6. The method according to claim 4 wherein no color filter is provided corresponding to the third pixel.

7. The method according to claim 2 wherein the first color filter passes blue light and absorbs light of other colors.

8. The method according to claim 2 wherein the light spectrum produced by the first light-emitting layer has substantial components corresponding to red and yellow.

9. The method according to claim 2 wherein the light spectrum produced by the second light-emitting layer has substantial components corresponding to blue.

10. The method according to claim 9 wherein no color filter is provided corresponding to the third pixel.

11. The method according to claim 2 wherein the first color filter passes red light and absorbs light of other colors.

12. The method according to claim 2 wherein the first and second pixels are disposed adjacent to each other.

13. The method according to claim 2 further providing a third light-emitting layer over the substrate for the fourth pixel.

14. The method according to claim 13 wherein the third light-emitting layer produces green light.

15. The method according to claim 2 wherein the second light-emitting layer is continuously provided over the third pixel and a fifth pixel, and forming a second color filter in operative relationship to the third pixel wherein the light produced by the second light-emitting layer has substantial spectral components corresponding to the light output desired for the third and fifth pixels.

16. The method according to claim 15 wherein the light spectrum produced by the first light-emitting layer has substantial components corresponding to blue and cyan.

17. The method according to claim 15 wherein the light spectrum produced by the second light-emitting layer has substantial components corresponding to red and yellow.

18. The method according to claim 15 wherein the first color filter passes blue light and absorbs light of other colors and the second color filter passes red light and absorbs light of other colors.

19. The method according to claim 15 wherein the third and fifth pixels are disposed adjacent to each other.

20. The method according to claim 2 wherein the first light-emitting layer is continuously provided over the first, second, and fourth pixels and forming a second color filter in operative relationship to the fourth pixel wherein the light produced by the second light-emitting layer has substantial spectral components corresponding to the light output desired for the first, second, and fourth pixels.

21. The method according to claim 20 wherein the second color filter passes green light and absorbs light of other colors.

22. The method according to claim 20 wherein the second pixel is adjacent to the first pixel and the fourth pixel is adjacent to the second pixel.

23. The method according to claim 20 wherein the second pixel is adjacent to the first pixel and the fourth pixel is adjacent to the first pixel.

24. The method according to claim 20 wherein the fourth pixel is adjacent to the second pixel and the fourth pixel is adjacent to the first pixel.

25. The method according to claim 15 wherein the first light-emitting layer is continuously provided over the first, second, and fourth pixels and forming a third color filter in operative relationship to the fourth pixel wherein the light produced by the second light-emitting layer has substantial spectral components corresponding to the light output desired for the first, second, and fourth pixels.

26. The method according to claim 25 wherein the third color filter passes green light and absorbs light of other colors.

27. The method according to claim 25 wherein the second pixel is adjacent to the first pixel and the fourth pixel is adjacent to the second pixel.

28. The method according to claim 25 wherein the second pixel is adjacent to the first pixel and the fourth pixel is adjacent to the first pixel.

29. The method according to claim 25 wherein the fourth pixel is adjacent to the second pixel and the fourth pixel is adjacent to the first pixel.

30. The method according to claim 15 wherein the second light-emitting layer is continuously provided over the third, fourth, and fifth pixels and forming a third color filter in operative relationship to the fourth pixel wherein the light produced by the second light-emitting layer has substantial spectral components corresponding to the light output desired for the third, fourth, and fifth pixels.

31. The method according to claim 30 wherein the third color filter passes green light and absorbs light of other colors.

32. The method according to claim 30 wherein the third pixel is adjacent to the fourth pixel and the fourth pixel is adjacent to the fifth pixel.

33. The method according to claim 30 wherein the third pixel is adjacent to the fifth pixel and the fourth pixel is adjacent to the fifth pixel.

34. The method according to claim 30 wherein the third pixel is adjacent to the fourth pixel and the fifth pixel is adjacent to the third pixel.

* * * * *